United States Patent
Yun et al.

(10) Patent No.: US 11,931,856 B2
(45) Date of Patent: Mar. 19, 2024

(54) POLISHING PAD, PROCESS FOR PREPARING THE SAME, AND PROCESS FOR PREPARING A SEMICONDUCTOR DEVICE USING THE SAME

(71) Applicant: SK enpulse Co., Ltd., Gyeonggi-do (KR)

(72) Inventors: Sunghoon Yun, Gyeonggi-do (KR); Hye Young Heo, Gyeonggi-do (KR); Jang Won Seo, Gyeonggi-do (KR)

(73) Assignee: SK ENPULSE CO., LTD., Gyeonggi-Do (KR)

( * ) Notice: Subject to any disclaimer, the term of this patent is extended or adjusted under 35 U.S.C. 154(b) by 5 days.

(21) Appl. No.: 17/592,706

(22) Filed: Feb. 4, 2022

(65) Prior Publication Data
US 2022/0152776 A1   May 19, 2022

Related U.S. Application Data

(62) Division of application No. 17/002,468, filed on Aug. 25, 2020, now Pat. No. 11,298,795.

(30) Foreign Application Priority Data

Oct. 29, 2019   (KR) .................. 10-2019-0135512
Oct. 30, 2019   (KR) .................. 10-2019-0136302

(51) Int. Cl.
*B24D 11/00*   (2006.01)
*B24B 37/24*   (2012.01)
(Continued)

(52) U.S. Cl.
CPC .............. *B24B 37/24* (2013.01); *B24B 37/26* (2013.01); *B24D 11/00* (2013.01); *B24D 11/003* (2013.01); *H01L 21/3212* (2013.01)

(58) Field of Classification Search
CPC ....... B24D 11/00; B24D 11/003; B24D 11/04; B24B 37/20; B24B 37/24; B24B 37/26
(Continued)

(56) References Cited

U.S. PATENT DOCUMENTS

| 6,913,517 | B2 * | 7/2005 | Prasad | B24B 37/24 |
| | | | | 451/526 |
| 7,160,181 | B2 * | 1/2007 | Jeung | B24B 37/205 |
| | | | | 451/287 |

(Continued)

FOREIGN PATENT DOCUMENTS

| CN | 101166604 A | 4/2008 |
| CN | 109048646 A * | 12/2018 | ............. B24B 37/22 |

(Continued)

OTHER PUBLICATIONS

Office Action for the Japanese Patent Application No. 2022-000716 issued by the Japanese Patent Office dated Mar. 14, 2023.
(Continued)

*Primary Examiner* — Eileen P Morgan
(74) *Attorney, Agent, or Firm* — IP & T GROUP LLP

(57) ABSTRACT

Embodiments relate to a polishing pad for use in a chemical mechanical planarization (CMP) process of semiconductors, a process for preparing the same, and a process for preparing a semiconductor device using the same. In the polishing pad according to the embodiment, the size (or diameter) and distribution of a plurality of pores are adjusted, whereby the polishing performance such as polishing rate and within-wafer non-uniformity can be further enhanced.

6 Claims, 3 Drawing Sheets

(51) Int. Cl.
*B24B 37/26* (2012.01)
*H01L 21/321* (2006.01)

(58) Field of Classification Search
USPC ................................ 451/526, 527, 530, 533
See application file for complete search history.

(56) References Cited

U.S. PATENT DOCUMENTS

| | | | |
|---|---|---|---|
| 7,927,186 B2* | 4/2011 | Ishida | B24B 37/24 |
| | | | 451/36 |
| 11,642,752 B2* | 5/2023 | Seo | C08G 18/4854 |
| | | | 51/298 |
| 2013/0012106 A1 | 1/2013 | Kazuno | |
| 2015/0056892 A1* | 2/2015 | Vacassy | C08J 9/122 |
| | | | 451/259 |
| 2018/0339394 A1* | 11/2018 | Ahn | C08G 18/3243 |
| 2019/0314954 A1* | 10/2019 | Heo | B24B 37/22 |
| 2019/0329376 A1* | 10/2019 | Heo | C08J 9/0019 |
| 2021/0229237 A1* | 7/2021 | Seo | C08J 9/122 |

FOREIGN PATENT DOCUMENTS

| | | |
|---|---|---|
| JP | 2011-200946 A | 10/2011 |
| WO | 2006/089293 A1 | 8/2006 |

OTHER PUBLICATIONS

Office Action for Chinese Patent Application No. 202011178119.X issued by the Chinese Patent Office dated Jul. 1, 2022.

* cited by examiner

[Fig. 1]
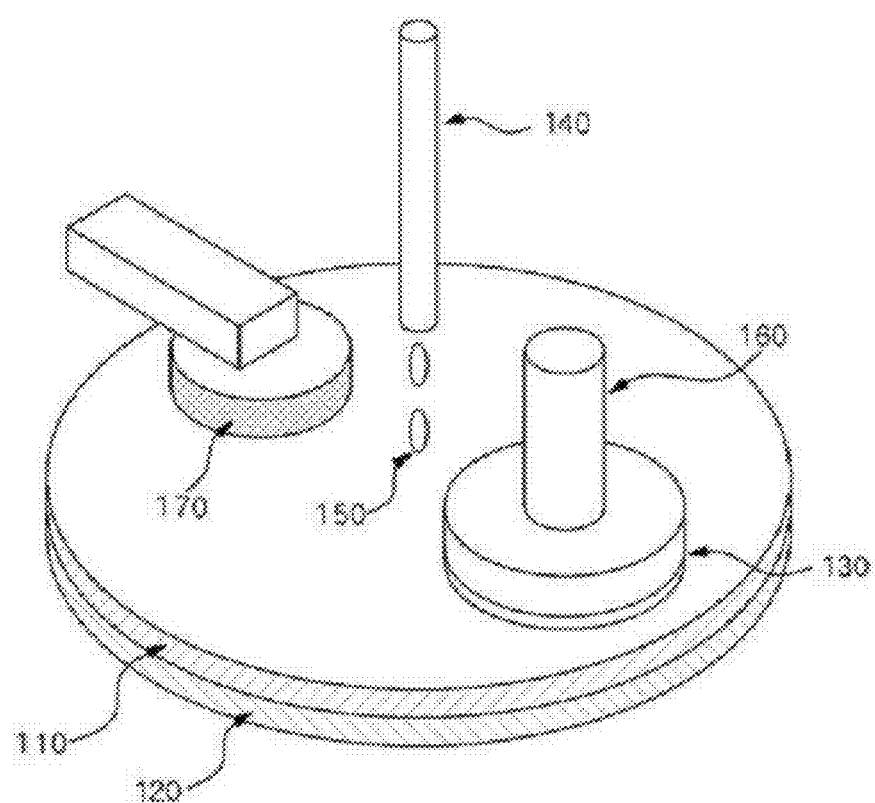

[Fig. 2]
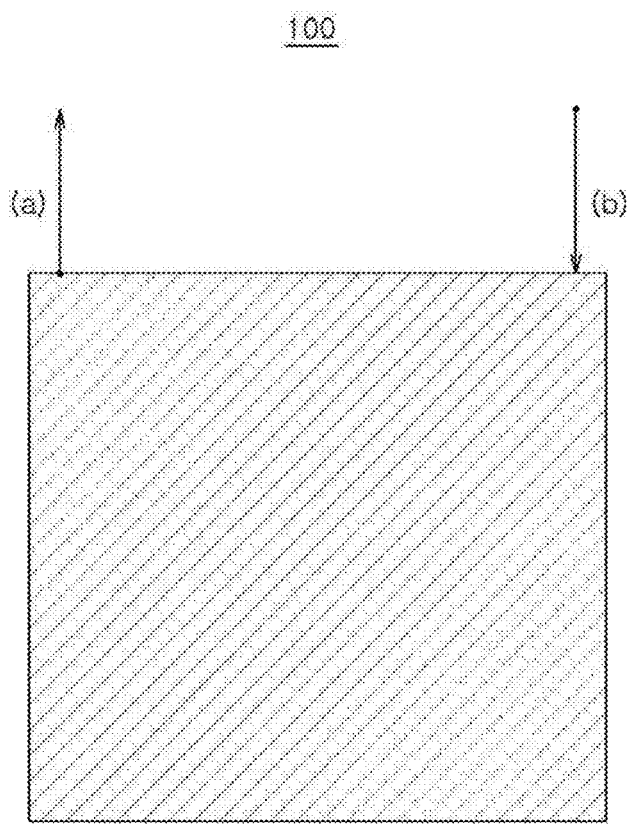

[Fig. 3]
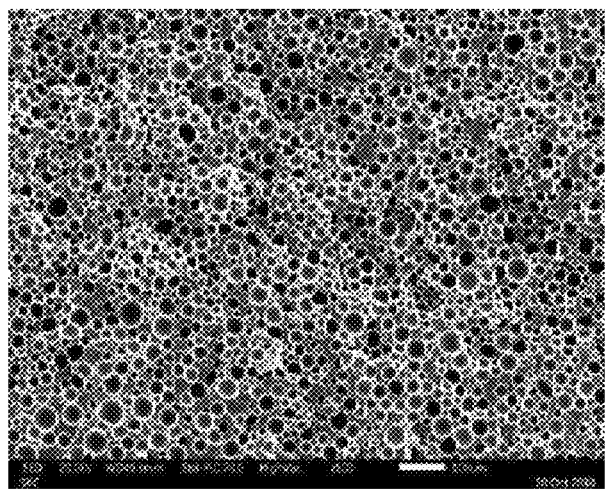
[Fig. 4]
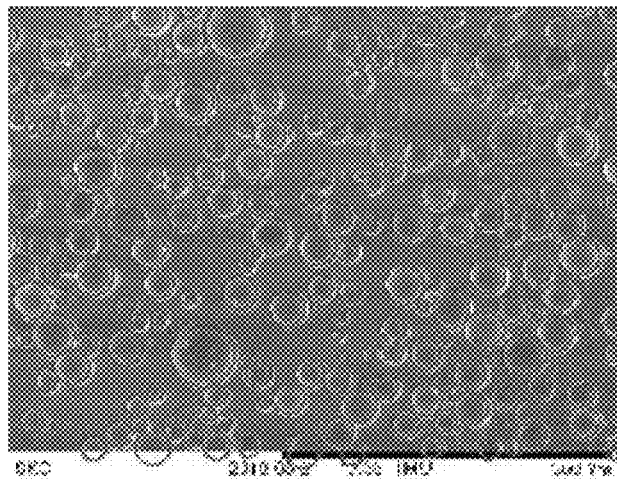

POLISHING PAD, PROCESS FOR PREPARING THE SAME, AND PROCESS FOR PREPARING A SEMICONDUCTOR DEVICE USING THE SAME

This application is a divisional of U.S. patent application Ser. No. 17/002,468 filed on Aug. 25, 2020, which claims priority of Korean patent application number 10-2019-0135512 filed on Oct. 29, 2019 and 10-2019-0136302 filed on Oct. 30, 2019, which is incorporated herein by reference in its entirety.

TECHNICAL FIELD

Embodiments relate to a polishing pad for use in a chemical mechanical planarization process of semiconductors, a process for preparing the same, and a process for preparing a semiconductor device using the same.

BACKGROUND ART

The chemical mechanical planarization (CMP) process in a process for preparing semiconductors refers to a step in which a semiconductor substrate such as a wafer is fixed to a head and in contact with the surface of a polishing pad mounted on a platen, and the wafer is then chemically treated by supplying a slurry while the platen and the head are relatively moved, to thereby mechanically planarize the irregularities on the semiconductor substrate.

A polishing pad is an essential member that plays an important role in such a CMP process. In general, a polishing pad is composed of a polyurethane-based resin and has grooves on its surface for a large flow of a slurry and pores for supporting a fine flow thereof.

The pores in a polishing pad may be formed by using a solid phase foaming agent having voids, a liquid phase foaming agent filled with a volatile liquid, an inert gas, a fiber, or the like, or by generating a gas by a chemical reaction.

As the solid phase foaming agent, microcapsules (i.e., thermally expanded microcapsules), whose size has been adjusted by a thermal expansion, are used. Since the thermally expanded microcapsules in a structure of already expanded micro-balloons have a uniform particle diameter, the diameter of pores can be uniformly controlled. However, the thermally expanded microcapsules have a disadvantage in that it is difficult to control the pores to be formed since the shape of the microcapsules changes under the reaction condition of a high temperature of 100° C. or higher. In addition, even if the quality uniformity is achieved in terms of the size and distribution of pores, the degree of freedom for designing the pores is not good, and there is a limit in controlling the pore distribution.

For example, Korean Laid-open Patent Publication No. 2016-0027075 discloses a process for producing a low-density polishing pad using an inert gas and a pore inducing polymer, and a low-density polishing pad. However, this patent publication has a limitation in the adjustment of the size and distribution of pores and fails to teach the polishing rate of the polishing pad.

Likewise, Korean Patent No. 10-0418648 discloses a process for producing a polishing pad using two kinds of solid phase foaming agents that have different particle diameters. However, this patent also has a limitation in the enhancement of the polishing performance by adjusting the size and distribution of pores.

DETAILED DESCRIPTION OF THE INVENTION

Technical Problem

Accordingly, an object of the embodiments is to provide a polishing pad whose polishing rate and within-wafer non-uniformity are enhanced by adjusting the size and distribution of pores, a process for preparing the same, and a process for preparing a semiconductor device using the polishing pad.

Solution to the Problem

In order to accomplish the above object, an embodiment provides a polishing pad, which comprises a polishing layer comprising a plurality of pores, wherein the total area of the pores per unit area (mm$^2$) of the polishing surface is 40% to 60%, the $D_q$ value represented by the following Equation 1 is 5 μm to 15 μm, the $D_{sk}$ value represented by the following Equation 2 is greater than 0.3 to less than 1, and the $D_{ku}$ value represented by the following Equation 3 is greater than 1 to less than 5:

$$D_q = \sqrt{\frac{\sum_{i=1}^{n} d_i^2}{n}} \quad \text{[Equation 1]}$$

$$D_{sk} = \frac{1}{nD_q^3}\left(\sum_{i=1}^{n} d_i^3\right) \quad \text{[Equation 2]}$$

$$D_{ku} = \frac{1}{nD_q^4}\left(\sum_{i=1}^{n} d_i^4\right) \quad \text{[Equation 3]}$$

In Equations 1 to 3, d is a value obtained by subtracting the number average diameter of the plurality of pores from each pore diameter, and n is the total number of pores per unit area (mm$^2$).

Another embodiment provides a polishing pad, which comprises a polishing layer comprising a plurality of pores, wherein, in the diameter distribution of the plurality of pores based on the polishing surface, the number average diameter ($D_a$) of the plurality of pores is 15 μm to 50 μm, and the pores ($A_{lu}$) having a diameter greater than the number average diameter of the plurality of pores by at least 200% are contained in an area ratio of 0.9% to less than 12% of the total area of the polishing surface.

Another embodiment provides a process for preparing a polishing pad, which comprises mixing a composition comprising a urethane-based prepolymer, a curing agent, and a foaming agent; and charging and injecting the composition into a mold under a predetermined pressure condition to form a polishing layer, wherein the polishing layer comprises a plurality of pores, the total area of the pores per unit area (mm$^2$) of the polishing surface is 40% to 60%, the $D_q$ value represented by the above Equation 1 is 5 μm to 15 μm, the $D_{sk}$ value represented by the above Equation 2 is greater than 0.3 to less than 1, and the $D_{ku}$ value represented by the above Equation 3 is greater than 1 to less than 5.

Another embodiment provides a process for preparing a polishing pad, which comprises mixing a composition comprising a urethane-based prepolymer, a curing agent, and a solid phase foaming agent; and charging and injecting the composition into a mold under a reduced pressure to form a polishing layer, wherein the reduced pressure is carried out at a vacuum degree of 0.6 kgf/cm$^2$ to less than 1 kgf/cm$^2$, the polishing pad comprises a polishing layer comprising a plurality of pores, in the diameter distribution of the plurality of pores based on the polishing surface, the number average diameter ($D_a$) of the plurality of pores is 15 μm to 50 μm, and the pores ($A_u$) having a diameter greater than the number average diameter of the plurality of pores by at least 200% are contained at an area ratio of 0.9% to less than 12% of the total area of the polishing surface.

Another embodiment provides a process for preparing a semiconductor device, which comprises mounting a polishing pad comprising a polishing layer comprising a plurality of pores on a platen; and relatively rotating the polishing surface of the polishing layer and the surface of a wafer while they are in contact with each other to polish the surface of the wafer, wherein the total area of the pores per unit area (mm²) of the polishing surface of the polishing layer is 40% to 60%, the $D_q$ value represented by the above Equation 1 is 5 μm to 15 μm, the $D_{sk}$ value represented by the above Equation 2 is greater than 0.3 to less than 1, and the $D_{ku}$ value represented by the above Equation 3 is greater than 1 to less than 5.

Another embodiment provides a process for preparing a semiconductor device, which comprises mounting a polishing pad comprising a polishing layer comprising a plurality of pores on a platen; and relatively rotating the polishing surface of the polishing layer and the surface of a wafer while they are in contact with each other to polish the surface of the wafer, wherein, in the diameter distribution of the plurality of pores based on the polishing surface, the number average diameter ($D_a$) of the plurality of pores is 15 μm to 50 μm, and the pores ($A_u$) having a diameter greater than the number average diameter of the plurality of pores by at least 200% are contained at an area ratio of 0.9% to less than 12% of the total area of the polishing surface.

Advantageous Effects of the Invention

According to the embodiments, the size (or diameter) and distribution of the plurality of pores contained in the polishing pad can be adjusted. As a result, in the polishing pad, the total area of pores per unit area and the pore distribution represented by $D_q$, $D_{sk}$, and $D_{ku}$ of Equations 1 to 3 have values in certain ranges, or the number average diameter ($D_a$) of the plurality of pores and the pores having a diameter greater than the number average diameter of the plurality of pores by at least 200% are controlled, whereby the polishing performance such as polishing rate and within-wafer non-uniformity can be further enhanced.

In addition, it is possible to efficiently fabricate a semiconductor device of excellent quality using the polishing pad.

BRIEF DESCRIPTION OF THE DRAWINGS

FIG. 1 schematically illustrates the process for preparing a semiconductor device according to an embodiment.

FIG. 2 is a schematic diagram showing a molding process using a mold according to an embodiment of the present invention.

FIG. 3 is a scanning electron microscope (SEM) image of pores of the polishing pad prepared in Example 1-1.

FIG. 4 is an image magnified by 100 times using a scanning electron microscope (SEM) on the polishing surface of 1 mm² of the polishing pad of Example 1-1.

BEST MODE FOR CARRYING OUT THE INVENTION

Hereinafter, the present invention will be described in detail.

In the description of the following embodiments, in the case where each layer or pad is mentioned to be formed "on" or "under" another layer or pad, it means not only that one element is "directly" formed on or under another element, but also that one element is "indirectly" formed on or under another element with other element(s) interposed between them.

The term on or under with respect to each element may be referenced to the drawings. For the sake of description, the sizes of individual elements in the appended drawings may be exaggeratingly depicted and do not indicate the actual sizes.

The term "plurality of" as used herein refers to more than one.

In this specification, when a part is referred to as "comprising" an element, it is to be understood that it may comprise other elements as well, rather than excluding the other elements, unless specifically stated otherwise.

In addition, all numerical ranges related to the physical properties, dimensions, and the like of a component used herein are to be understood as being modified by the term "about," unless otherwise indicated.

Hereinafter, the present invention is explained in detail by the following embodiments. The embodiments can be modified into various forms as long as the gist of the invention is not changed.

Polishing Pad

The polishing pad according to an embodiment comprises a polishing layer comprising a plurality of pores, wherein the total area of pores per unit area (mm²) of the polishing surface is 40% to 60%, the $D_q$ value represented by the following Equation 1 is 5 μm to 15 μm, the $D_{sk}$ value represented by the following Equation 2 is greater than 0.3 to less than 1, and the $D_{ku}$ value represented by the following Equation 3 is greater than 1 to less than 5.

$$D_q = \sqrt{\frac{\sum_{i=1}^{n} d_i^2}{n}} \qquad \text{[Equation 1]}$$

$$D_{sk} = \frac{1}{nD_q^3}\left(\sum_{i=1}^{n} d_i^3\right) \qquad \text{[Equation 2]}$$

$$D_{ku} = \frac{1}{nD_q^4}\left(\sum_{i=1}^{n} d_i^4\right) \qquad \text{[Equation 3]}$$

In Equations 1 to 3, d is a value obtained by subtracting the number average diameter of the plurality of pores from each pore diameter, and n is the total number of pores per unit area (mm²).

$D_q$, $D_{sk}$, and $D_{ku}$ of Equations 1 to 3 may be calculated using the respective pore diameters, the number average diameter of the plurality of pores ($D_a$), and the total number of pores per unit area.

The pore diameter, the number average diameter of the plurality of pores, and the total number of pores may be calculated by measuring the pore diameters of the respective pores and the number of pores observed using a scanning electron microscope (SEM) and an image analysis software on the basis of 1 mm² of the polishing surface. The polishing surface may refer to any one surface that is continuous in the thickness direction of the polishing layer. In addition, the polishing surface may be the outermost surface exposed immediately after the preparation of the polishing pad or the outermost surface exposed after the polishing process is carried out for a certain period of time.

The flowability of a polishing slurry and the polishing efficiency hinge on the diameters and the distribution degree of the pores exposed on the surface of the polishing pad. That is, the flowability of a polishing slurry is affected by the diameters of the pores exposed on the surface of the polishing pad, and the occurrence of scratches on the surface of the object to be polished and the polishing rate may be determined by the distribution of pore diameters.

In the polishing pad according to an embodiment, the total area of pores and such parameters as $D_q$, $D_{sk}$, and $D_{ku}$ of Equations 1 to 3 can be designed to have a specific range, respectively, by adjusting the number average diameter of the plurality of pores and the total number of pores per unit area. As a result, an excellent polishing rate and within-wafer non-uniformity can be achieved.

Thus, it is very important to control the diameter of pores and the distribution degree of pores in the polishing pad. In particular, in order to enhance the polishing performance, it is very important to design the pore diameters according to the polishing mechanism between the slurry and the semiconductor substrate in the CMP process.

The $D_q$ value represented by the above Equation 1 is a parameter closely related to the pore diameters in the pore distribution. It is a measure of how much the pores are distributed in the pore distribution graph with respect to the number average diameter of the pores. The larger the $D_q$ value, the larger the distribution degree of pores. The smaller the $D_q$ value, the smaller the distribution degree.

The $D_q$ value may be calculated from a root mean square (rms) of the difference d between the pore diameters of the polishing surface and the number average diameter ($D_a$) of the plurality of pores. The $D_q$ value according to an embodiment may be 5 µm to 15 µm, specifically 7 µm to 14 µm, more specifically 7 µm to 13 µm, greater than 10 m to 15 µm, 5 µm to 10 µm, or 8 µm to 12 µm. If the $D_q$ value is within the above range, the polishing performance such as polishing rate and within-wafer non-uniformity may be excellent. If the $D_q$ value exceeds 15 µm, the polishing performance that requires physical CMP, in particular, the polishing rate when a tungsten layer is polished may be excessively increased, and the within-wafer non-uniformity for an oxide layer and a tungsten layer may be deteriorated. On the other hand, if the $D_q$ value is less than 5 µm, the amount of a slurry carried per area of the pad is small, so that the polishing rate when a tungsten layer is polished may be excessively decreased, or the within-wafer non-uniformity for an oxide layer may be deteriorated.

The number average diameter ($D_a$) of the plurality of pores on the polishing surface in Equation 1 may be defined as an average value obtained by dividing the sum of the diameters of the plurality of pores on 1 mm² of the polishing surface by the number of pores. According to an embodiment, the $D_a$ may be 15 µm to 25 µm, specifically 18 µm to 25 µm, more specifically 18 µm to 23 µm or 18 µm to 22 µm. If the polishing pad has a $D_a$ within the above range, the polishing rate and within-wafer non-uniformity can be enhanced. If the $D_a$ is less than 15 µm, the polishing rate when a tungsten layer is polished may be excessively decreased, and the within-wafer non-uniformity for an oxide layer may be deteriorated. On the other hand, if it exceeds 25 µm, both of the polishing rate and within-wafer non-uniformity for a tungsten layer and an oxide layer may be poor.

In addition, the $D_{sk}$ value represented by the above Equation 2 may refer to the inclination degree of the pore distribution graph with respect to the number average diameter of pores in the pore distribution graph. Specifically, the $D_{sk}$ is a measure indicating how much the pore distribution graph is inclined toward the smaller or larger side with respect to the number average diameter of pores in the pore distribution graph. If it is less than 1, the pore distribution graph is inclined toward the smaller side as compared with the number average diameter of pores with respect to a normal distribution. If it is greater than 1, the pore distribution graph is inclined toward the larger side as compared with the number average diameter of pores with respect to a normal distribution.

The $D_{sk}$ value according to an embodiment may be greater than 0.3 to less than 1, specifically greater than 0.4 to less than 1, more specifically 0.4 to 0.9, greater than 0.6 to less than 1, or greater than 0.3 to 0.6. If the $D_{sk}$ value is within the above range, the number of pores larger than the number average diameter of the pores is larger, in which case the polishing performance such as polishing rate and within-wafer non-uniformity may be excellent. If the $D_{sk}$ value is 0.3 or less, the number of pores smaller than the number average diameter of the pores is larger, in which case the amount of a slurry carried per area of the pad is small, the polishing rate, especially when a tungsten layer is polished, may be significantly decreased. If the $D_{sk}$ value is 1 or more, the polishing rate when a tungsten layer is polished may be excessively increased, and the within-wafer non-uniformity for a tungsten layer and an oxide layer may be deteriorated.

Meanwhile, the $D_{ku}$ value represented by the above Equation 3 indicates how much the overall pore distribution spreads. If it is less than 3, the pore distribution is sharp as compared with a normal distribution at the average pore diameter. If it is greater than 3, the pore distribution is broad with respect to a normal distribution.

According to an embodiment of the present invention, the $D_{ku}$ value is close to 3, which may be greater than 1 to less than 5, greater than 2 to less than 5, 2.5 to 4.5, greater than 3.5 to less than 5, greater than 1 to 3.5, greater than 1 to 4, greater than 2 to 3, or greater than 3 to less than 4.5. If the $D_{ku}$ value satisfies the above range, the flowability of a polishing slurry is excellent, thereby enhancing the polishing rate and within-wafer non-uniformity. If the $D_{ku}$ value is 1 or less, the polishing rate when a tungsten layer is polished may be excessively decreased. If the $D_{ku}$ value is 5 or more, the pore diameters are not uniform, which may adversely affect the flowability of a polishing slurry, resulting in scratches on the surface of the object to be polished. Thus, the polishing rate and within-wafer non-uniformity may be deteriorated.

According to an embodiment, n in Equations 1 to 3, which stands for the total number of pores per unit area (mm²), may be 700 to 2,500, specifically 750 to 2,200. In addition, d, which stands for the difference between each pore diameter and the number average diameter of the plurality of pores, may be −30 to 60, specifically −20 to 50.

In addition, the total area of pores per unit area of the polishing surface in the polishing pad may be 40% to 60%, specifically 40% to 55%, more specifically 40% to 50%, greater than 50% to 60%, or 45% to 53%. If the total area of pores is less than 40%, the polishing rate when a tungsten layer is polished may be excessively decreased, and the within-wafer non-uniformity for an oxide layer may be deteriorated. On the other hand, if the total area of pores exceeds 60%, the polishing rate when a tungsten layer is polished may be excessively increased, or the polishing rate when an oxide layer is polished may be excessively decreased. In addition, the within-wafer non-uniformity for a tungsten layer may be significantly deteriorated.

In the polishing pad according to an embodiment of the present invention, the total area of pores per unit area of the polishing surface and the $D_q$, $D_{sk}$, and $D_{ku}$ of Equations 1 to 3 must satisfy the above ranges.

According to an embodiment, in the polishing pad, the total area of pores per unit area of the polishing surface may be 40% to 60%, the $D_q$ value may be greater than 10 μm to 15 μm, the $D_{sk}$ value may be greater than 0.6 to less than 1, and the $D_{ku}$ value may be greater than 3.5 to less than 5.

According to another embodiment, in the polishing pad, the total area of pores per unit area of the polishing surface may be greater than 50% to 60%, the $D_q$ value may be 5 μm to 10 μm, the $D_{sk}$ value may be greater than 0.3 to 0.6, and the $D_{ku}$ value may be greater than 1 to 3.5.

The polishing pad according to another embodiment comprises a polishing layer comprising a plurality of pores, wherein, in the diameter distribution of the plurality of pores based on the polishing surface, the number average diameter ($D_a$) of the plurality of pores is 15 μm to 50 μm, and the pores ($A_u$) having a diameter greater than the number average diameter of the plurality of pores by at least 200% are contained at an area ratio of 0.9% to less than 12% of the total area of the polishing surface.

The number average diameter and the area ratio of the plurality of pores may be calculated by measuring the pore diameters of the respective pores observed using a scanning electron microscope (SEM) and an image analysis software. The polishing surface may refer to any one surface that is continuous in the thickness direction of the polishing layer. In addition, the polishing surface may be the outermost surface exposed immediately after the preparation of the polishing pad or the outermost surface exposed after the polishing process is carried out for a certain period of time.

The flowability of a polishing slurry and the polishing efficiency hinge on the diameters of the pores exposed on the surface of the polishing pad. That is, the flowability of a polishing slurry is affected by the diameters of the pores exposed on the surface of the polishing pad, and the occurrence of scratches on the surface of the object to be polished and the polishing rate may be determined by the distribution of pore diameters. In particular, if the pores are not uniform, it may impair the uniformity of polishing performance. In the polishing pad according to an embodiment, the pores having a diameter greater than the number average diameter of the plurality of pores by at least 200% are controlled, thereby enhancing the uniformity of pores and the uniformity of polishing performance. As a result, an excellent polishing rate and within-wafer non-uniformity can be achieved.

According to an embodiment of the present invention, the polishing pad comprises a polishing layer comprising a plurality of pores, wherein the $D_q$ value represented by the above Equation 1 is 5 μm to 15 μm, the $D_{sk}$ value represented by the above Equation 2 is greater than 0.3 to less than 1, the $D_{ku}$ value represented by the above Equation 3 is greater than 1 to less than 5, in the diameter distribution of the plurality of pores based on the polishing surface, the number average diameter ($D_a$) of the plurality of pores is 15 μm to 50 μm, and the pores ($A_u$) having a diameter greater than the number average diameter of the plurality of pores by at least 200% are contained at an area ratio of 0.9% to less than 12% of the total area of the polishing surface. In addition, the total area of pores per unit area (mm²) of the polishing surface may be 40% to 60%.

Since the pore distribution represented by $D_q$, $D_{sk}$, and $D_{ku}$ of Equations 1 to 3 is satisfied and the pores having a diameter greater than the number average diameter ($D_a$) of the plurality of pores by at least 200% are controlled, the uniformity of polishing performance can be enhanced, and the polishing performance such as polishing rate and within-wafer non-uniformity can be further enhanced.

In the diameter distribution of the plurality of pores based on the polishing surface of the polishing pad, the number average diameter ($D_a$) of the plurality of pores may be 15 μm to 50 μm, 15 μm to 30 μm, 15 μm to 25 μm, 15 μm to 23 μm, 15 μm to 21 μm, or 18 μm to 25 μm.

The $D_a$ is a number average diameter of a plurality of pores, which may be defined as an average value obtained by dividing the sum of the diameters of the plurality of pores by the number of pores.

If the polishing pad according to an embodiment of the present invention has a $D_a$ within the above range, the polishing rate and within-wafer non-uniformity can be enhanced. If the $D_a$ is less than 15 μm, the polishing rate when an oxide layer is polished may be excessively increased, or the polishing rate when a tungsten layer is polished may be excessively decreased, and the within-wafer non-uniformity may be excessively deteriorated. On the other hand, if the $D_a$ exceeds 50 μm, the polishing rate when a tungsten layer is polished may be excessively increased, or the within-wafer non-uniformity may be excessively decreased.

The pores ($A_u$) having a diameter greater than the number average diameter of the plurality of pores by at least 200% may be referred to as abnormal pores in the present specification. The area ratio thereof $A_u$ (%) may be calculated by the following Equation 4:

$$A_u \ \% = \frac{A_u(\mu m^2)}{A_t(\mu m^2)} \times 100(\%) \qquad [\text{Equation 4}]$$

In Equation 4, $A_t$(μm²) is the total measurement area, and $A_u$ (μm²) is the area of pores having a diameter greater than the number average diameter of a plurality of pores by at least 200%.

The $A_u$ (%) may be 0.9% to less than 12%, 0.9% to less than 10%, 1% to less than 12%, 1% to 10%, 0.9% to less than 5%, 0.9% to less than 4%, 2% to 10%, 5% to 11%, or 6% to 11%, of the total area of the polishing surface. If the polishing pad has an $A_u$ (%) within the above range, it is possible to satisfy the overall uniformity of pores and, further, to enhance the uniform polishing performance during the CMP process. If the polishing pad has an $A_u$ (%) exceeding the above range, the overall uniformity of pores may be impaired, which may make it difficult to achieve uniform polishing performance. As a result, the within-wafer non-uniformity for a tungsten layer and an oxide layer may be excessively deteriorated, and the polishing rate when an oxide layer is polished may be decreased. On the other hand, if the polishing pad has an $A_u$ (%) of less than the above range, the polishing rate when a tungsten layer is polished may be excessively decreased, and the polishing rate when an oxide layer is polished may be excessively increased, thereby adversely affecting the polishing performance.

According to an embodiment, the diameter ($D_u$) of $A_u$ is greater than twice the number average diameter ($D_a$) of the plurality of pores, and the $D_u$ may be calculated by the following Inequation 5:

$$D_u > D_a \times 2 \quad \text{[Inequation 5]}$$

In Inequation 5, $D_u$ is the diameter of pores having a diameter greater than the number average diameter of a plurality of pores by at least 200%, and $D_a$ is the number average diameter of a plurality of pores.

According to an embodiment, the $D_u$ may be 100 μm or more, specifically 100 μm to 150 μm.

The total area ratio ($A_p$ (%)) of the plurality of pores may be 30% to 55%, 35% to 55%, 35% to 53%, 35% to 50%, 35% to less than 45%, 45% to 55%, or 46% to 53%, of the total area of the polishing surface. It may be calculated by the following Equation 6:

$$A_p \, \% = \frac{A_p(\mu m^2)}{A_t(\mu m^2)} \times 100 (\%) \quad \text{[Equation 6]}$$

In Equation 6, $A_t(\mu m^2)$ is the total measurement area, and $A_p$ ($\mu m^2$) is the total area of a plurality of pores.

Meanwhile, the pores ($A_n$) other than the pores having a diameter greater than the number average diameter of the plurality of pores by at least 200% may be referred to as normal pores in the present specification. The area ratio thereof $A_n$ (%) may be calculated by the following Equation 7:

$$A_n \, \% = \frac{A_n(\mu m^2)}{A_t(\mu m^2)} \times 100 (\%) \quad \text{[Equation 7]}$$

In Equation 7, $A_t(\mu m^2)$ is the total measurement area, and $A_n$ ($\mu m^2$) is the area of the pores other than the pores having a diameter greater than the number average diameter of a plurality of pores by at least 200%.

The $A_n$ (%) may be 34% to 54%, 34% to 45%, 35% to 50%, greater than 39% 20 to 52%, or greater than 39% to less than 50%, of the total area of the polishing surface.

Meanwhile, the pore diameter at the maximum peak in the diameter distribution of the plurality of pores based on the polishing surface may be 10 μm to 150 μm. In addition, the pore diameter at the maximum peak may be defined as the diameter of pores that have the highest ratio of the sum of the cross-sectional areas thereof.

The pore diameter at the maximum peak in the diameter distribution of the plurality of pores based on the polishing surface may be, for example, 10 μm to 150 μm, for example, 15 μm to 40 μm, for example, 17 μm to 30 μm. In addition, the pore diameter at the maximum peak in the diameter distribution of the plurality of pores based on the polishing surface may be 60 μm to 150 μm, specifically 60 μm to 100 μm.

According to an embodiment, if the pore distribution represented by $D_q$, $D_{sk}$, and $D_{ku}$ of Equations 1 to 3 is satisfied, the pore diameter at the maximum peak in the diameter distribution of the plurality of pores based on the polishing surface may be, for example, 10 μm to 50 μm.

According to another embodiment, if the number average diameter ($D_a$) of the plurality of pores is 15 μm to 50 μm and if the pores ($A_u$) having a diameter greater than the number average diameter of the plurality of pores by at least 200% are contained at an area ratio of 0.9% to less than 12% of the total area of the polishing surface, the pore diameter at the maximum peak in the diameter distribution of the plurality of pores based on the polishing surface may be 60 μm to 150 μm.

In addition, the pore diameter at the maximum peak may be larger or smaller than the number average diameter of the plurality of pores by 5 μm to 30 μm. Alternatively, the pore diameter at the maximum peak may be larger or smaller than the number average diameter of the plurality of pores by 10 μm to 20 μm.

According to the above embodiment, the diameters and distribution of a plurality of pores contained in the polishing pad can be adjusted, whereby the specific range of the total area of pores per unit area of the polishing surfaces, the ranges of $D_q$, $D_{sk}$, and $D_{ku}$ of Equations 1 to 3, and/or the number average diameter ($D_a$) of the plurality of pores and the area ratio of the pores having a diameter greater than the number average diameter of the plurality of pores by at least 200% are satisfied. As a result, the polishing rate and within-wafer non-uniformity can be further enhanced.

The polishing pad may have a polishing rate of 600 Å/min to 900 Å/min when a tungsten layer is polished. The polishing pad may have a polishing rate of 2,700 Å/min to 3,300 Å/min when an oxide layer is polished.

For example, if the polishing pad satisfies the specific range of the total area of pores per unit area of the polishing surface and the ranges of $D_q$, $D_{sk}$, and $D_{ku}$ of Equations 1 to 3, the polishing rate and within-wafer non-uniformity can be further enhanced. Specifically, the polishing pad may have a polishing rate of 720 Å/min to 860 Å/min, specifically 730 Å/min to 850 Å/min, more specifically 750 Å/min to 850 Å/min, when a tungsten layer is polished.

In addition, the polishing pad may have a polishing rate of 2,750 Å/min to 3,300 Å/min, specifically 2,800 Å/min to 3,200 Å/min, more specifically 2,900 Å/min to 3,200 Å/min or 2,900 Å/min to 3,150 Å/min, when an oxide layer is polished.

Further, with regard to the within-wafer non-uniformity (WIWNU) of a semiconductor substrate, for example, a wafer, which indicates the polishing uniformity in the wafer surface, the within-wafer non-uniformity may be less than 12%, for example, less than 11%, for example, less than 10%, for example, less than 9%, for example, less than 5%, 4.8% or less, or 4.5% or less, for a tungsten layer. In addition, the within-wafer non-uniformity may be 10% or less, for example, less than 10%, for example, less than 9%, for example, less than 6%, for example, less than 4.5%, 4.0% or less, or 3.8% or less, when an oxide layer is polished.

Meanwhile, according to the above embodiment, if the number average diameter ($D_a$) of the plurality of pores contained in the polishing pad and the pores having a diameter greater than the number average diameter of the plurality of pores by at least 200% are controlled, the polishing rate and within-wafer non-uniformity can be further enhanced. Specifically, the polishing pad may have a polishing rate of 610 Å/min to 900 Å/min, 610 Å/min to 850 Å/min, 610 Å/min to 820 Å/min, or 615 Å/min to 800 Å/min, when a tungsten layer is polished.

In addition, the polishing pad may have a polishing rate of 2,860 Å/min to 3,250 Å/min, 2,900 Å/min to 3,200 Å/min, or 2,920 Å/min to 3,200 Å/min, when an oxide layer is polished.

Further, with regard to the within-wafer non-uniformity (WIWNU), which indicates the polishing uniformity in the surface of a semiconductor substrate, the within-wafer non-uniformity may be less than 10%, less than 9%, 4.5% or less, or less than 4.3%, for a tungsten layer. In addition, the within-wafer non-uniformity may be less than 12%, less than 10%, less than 9%, less than 8%, less than 6%, less than 5%, or less than 4%, when an oxide layer is polished.

The polishing pad may further comprise at least one reaction rate controlling agent selected from the group consisting of a tertiary amine-based compound and an organometallic compound; and a silicone-based surfactant.

Process for Preparing a Polishing Pad

The process for preparing a polishing pad may comprise mixing a composition comprising a urethane-based prepolymer, a curing agent, and a foaming agent; and charging and injecting the composition into a mold under a predetermined pressure, or a reduced pressure, condition to form a polishing layer.

The process for preparing a polishing pad according to an embodiment comprises mixing a composition comprising a urethane-based prepolymer, a curing agent, and a foaming agent (step 1); and charging and injecting the composition into a mold under a predetermined pressure condition to form a polishing layer (step 2), wherein the polishing layer comprises a plurality of pores, the total area of the pores per unit area ($mm^2$) of the polishing surface is 40% to 60%, the $D_q$ value represented by the above Equation 1 is 5 μm to 15 μm, the $D_{sk}$ value represented by the above Equation 2 is greater than 0.3 to less than 1, and the $D_{ku}$ value represented by the above Equation 3 is greater than 1 to less than 5.

The process for preparing a polishing pad according to another embodiment may comprise mixing a composition comprising a urethane-based prepolymer, a curing agent, and a solid phase foaming agent (step 1); and charging and injecting the composition into a mold under a reduced pressure to form a polishing layer (step 2), wherein the reduced pressure may be carried out at a vacuum degree of 0.6 kgf/$cm^2$ to less than 1 kgf/$cm^2$. According to the above preparation process, it is possible to control the number average diameter of the plurality of pores and the pores having a diameter greater than the number average diameter of the plurality of pores by at least 200% by adjusting the reduced pressure condition.

The process for preparing a polishing pad according to another embodiment may comprise the above steps 1 and 2, wherein the pore distribution represented by $D_q$, $D_{sk}$, and $D_{ku}$ of Equations 1 to 3 is satisfied, and the pores having a diameter greater than the number average diameter ($D_a$) of the plurality of pores by at least 200% are controlled to the above range.

According to an embodiment of the present invention, the pore characteristics can be controlled by adjusting the contents of the urethane-based prepolymer, the curing agent, and the foaming agent. Specifically, in the above preparation process, the type and content of the foaming agent, especially a solid phase foaming agent and/or a gas phase foaming agent, are adjusted, the content of the reaction rate controlling agent is adjusted, if necessary, and the pressure in the mold is adjusted, thereby adjusting the pore diameters, the number average diameter of the plurality of pores, the total number of pores per unit area, and the total area of the pores. Thus, it is possible to control the specific values of the $D_q$, $D_{sk}$, and $D_{ku}$ and/or the number average diameter ($D_a$) of the plurality of pores and the pores having a diameter greater than the number average diameter of the plurality of pores by at least 200%, whereby the polishing performance such as polishing rate and within-wafer non-uniformity can be enhanced.

In addition, the abnormal pores having a diameter greater than the number average diameter of the plurality of pores by at least 200% may be unintentionally formed due to the instability of the process. For example, the abnormal pores may be increased for the reasons that excessive pores are injected due to the inappropriate control of the pressure condition, the solid phase foaming agent is expanded to an abnormal size, or open cells are formed due to the deformation of the solid phase foaming agent. According to an embodiment of the present invention, the abnormal pores can be adjusted to an appropriate range by controlling the incorporation of air or bubbles through high-pressure injection and discharge by depressurization, and the pore distribution can be adjusted to an appropriate range by appropriately controlling the size of the solid phase foaming agent.

Specifically, the process for preparing a polishing pad according to an embodiment may comprise mixing a composition comprising a urethane-based prepolymer, a curing agent, and a foaming agent (step 1).

Step 1 is a step of mixing the respective components, through which it is possible to obtain a composition comprising a mixture of a urethane-based prepolymer, a foaming agent, and a curing agent. The curing agent may be added together with the urethane-based prepolymer and the solid phase foaming agent, or the urethane-based prepolymer and the solid phase foaming agent may be mixed first, followed by second mixing of the curing agent.

As an example, the urethane-based prepolymer, the solid phase foaming agent, and the curing agent may be put into the mixing step substantially at the same time.

As another example, the urethane-based prepolymer and the solid phase foaming agent may be mixed in advance, and the curing agent may be subsequently introduced. That is, the curing agent may not be mixed in advance with the urethane-based prepolymer. If the curing agent is mixed in advance with the urethane-based prepolymer, it may be difficult to control the reaction rate. In particular, the stability of the prepolymer having an isocyanate terminal group may be significantly impaired.

The step of preparing the mixture is a step for initiating the reaction of the urethane-based prepolymer and the curing agent by mixing them and uniformly dispersing the solid phase foaming agent. Specifically, the mixing may be carried out at a speed of 1,000 rpm to 10,000 rpm or 4,000 rpm to 7,000 rpm. Within the above speed range, it may be more advantageous for the solid phase foaming agent to be uniformly dispersed in the raw materials.

The urethane-based prepolymer and the curing agent may be mixed at a molar equivalent ratio of 1:0.8 to 1:1.2, or a molar equivalent ratio of 1:0.9 to 1:1.1, based on the number of moles of the reactive groups in each molecule. Here, "the number of moles of the reactive groups in each molecule" refers to, for example, the number of moles of the isocyanate group in the urethane-based prepolymer and the number of moles of the reactive groups (e.g., amine group, alcohol group, and the like) in the curing agent. Therefore, the urethane-based prepolymer and the curing agent may be fed at a constant rate during the mixing process by controlling the feeding rate such that the urethane-based prepolymer and the curing agent are fed in amounts per unit time that satisfies the molar equivalent ratio exemplified above.

Hereinafter, the specific components employed in the polishing pad will be described in detail.

Urethane-Based Prepolymer

A prepolymer generally refers to a polymer having a relatively low molecular weight wherein the degree of polymerization is adjusted to an intermediate level for the sake of conveniently molding a product in the process of producing the same. A prepolymer may be molded by itself or after a reaction with another polymerizable compound. For example, a prepolymer may be prepared by reacting an isocyanate compound with a polyol.

For example, the isocyanate compound that may be used in the preparation of the urethane-based prepolymer may be at least one isocyanate selected from the group consisting of toluene diisocyanate (TDI), naphthalene-1,5-diisocyanate, p-phenylene diisocyanate, tolidine diisocyanate, 4,4'-diphenylmethane diisocyanate, hexamethylene diisocyanate, dicyclohexylmethane diisocyanate, and isophorone diisocyanate.

For example, the polyol that may be used in the preparation of the urethane-based prepolymer may be at least one polyol selected from the group consisting of a polyether polyol, a polyester polyol, a polycarbonate polyol, and an acryl polyol. The polyol may have a weight average molecular weight (Mw) of 300 g/mole to 3,000 g/mole.

The urethane-based prepolymer may be prepared by reacting an isocyanate compound with a polyol as described above. The specific types of the isocyanate compound and the polyol are as exemplified above with respect to the polishing pad.

The urethane-based prepolymer may have a weight average molecular weight of 500 g/mole to 3,000 g/mole. Specifically, the urethane-based prepolymer may have a weight average molecular weight (Mw) of 600 g/mole to 2,000 g/mole or 800 g/mole to 1,000 g/mole.

As an example, the urethane-based prepolymer may be a polymer having a weight average molecular weight (Mw) of 500 g/mole to 3,000 g/mole, which is polymerized from toluene diisocyanate as an isocyanate compound and polytetramethylene ether glycol as a polyol.

Curing Agent

The curing agent may be at least one of an amine compound and an alcohol compound. Specifically, the curing agent may comprise at least one compound selected from the group consisting of an aromatic amine, an aliphatic amine, an aromatic alcohol, and an aliphatic alcohol.

For example, the curing agent may be at least one selected from the group consisting of 4,4'-methylenebis(2-chloroaniline) (MOCA), diethyltoluenediamine, diaminodiphenylmethane, diaminodiphenyl sulphone, m-xylylenediamine, isophoronediamine, ethylenediamine, diethylenetriamine, triethylenetetramine, polypropylenediamine, polypropylenetriamine, ethylene glycol, diethylene glycol, dipropylene glycol, butanediol, hexanediol, glycerin, and trimethylolpropane.

Foaming Agent

The foaming agent is a component for forming a pore structure in the polishing layer. It is not particularly limited as long as it is commonly used for forming voids in a polishing pad.

For example, the foaming agent may be at least one selected from a solid phase foaming agent having a hollow structure, a liquid phase foaming agent using a volatile liquid, and an inert gas. Specifically, the foaming agent may comprise a gas phase foaming agent, a solid phase foaming agent, or both.

Solid Phase Foaming Agent

The solid phase foaming agent is thermally expanded (i.e., size-controlled) microcapsules and may be in a structure of micro-balloons having an average pore size of 5 μm to 200 μm. The thermally expanded (i.e., size-controlled) microcapsules may be obtained by thermally expanding thermally expandable microcapsules.

The thermally expandable microcapsule may comprise a shell comprising a thermoplastic resin; and a foaming agent encapsulated inside the shell. The thermoplastic resin may be at least one selected from the group consisting of a vinylidene chloride-based copolymer, an acrylonitrile-based copolymer, a methacrylonitrile-based copolymer, and an acrylic-based copolymer. Further, the foaming agent encapsulated in the inside may be at least one selected from the group consisting of hydrocarbons having 1 to 7 carbon atoms. Specifically, the foaming agent encapsulated in the inside may be selected from the group consisting of a low molecular weight hydrocarbon such as ethane, ethylene, propane, propene, n-butane, isobutane, butene, isobutene, n-pentane, isopentane, neopentane, n-hexane, heptane, petroleum ether, and the like; a chlorofluorohydrocarbon such as trichlorofluoromethane ($CCl_3F$), dichlorodifluoromethane ($CCl_2F_2$), chlorotrifluoromethane ($CClF_3$), tetrafluoroethylene ($CClF_2$—$CClF_2$), and the like; and a tetraalkylsilane such as tetramethylsilane, trimethylethylsilane, trimethylisopropylsilane, trimethyl-n-propylsilane, and the like.

According to an embodiment of the present invention, the solid phase foaming agent may have an average particle diameter (D50) of 20 μm to 50 μm. Here, the term D50 may refer to the volume fraction of the 50th percentile (median) of a particle diameter distribution. More specifically, the solid phase foaming agent may have a D50 of 25 μm to 48 μm. Even more specifically, the solid phase foaming agent may have a D50 of 25 μm to 40 μm; 28 μm to 40 μm; or 30 μm to 40 μm. If the D50 of the solid phase foaming agent satisfies the above range, the polishing rate and within-wafer non-uniformity can be further enhanced. If the D50 of the solid phase foaming agent is less than the above range, the number average diameter of pores is small, which may have an impact on the polishing rate and within-wafer non-uniformity. If it exceeds the above range, the number average diameter of pores is excessively large, which may have an impact on the polishing rate and within-wafer non-uniformity.

In addition, the standard deviation for the average particle diameter of the solid phase foaming agent may be 15 or less, 13 or less, 11 or less, 7 to 11, or 7.5 to 10.4.

The solid phase foaming agent may be employed in an amount of 0.5 part by weight to 3 parts by weight based on 100 parts by weight of the urethane-based prepolymer.

The solid phase foaming agent may be employed in an amount of greater than 0.5 part by weight to less than 2.5 parts by weight, 0.6 part by weight to 2.3 parts by weight, 0.8 part by weight to 2 parts by weight, 0.8 part by weight to 1.8 parts by weight, 1.0 part by weight to 2.0 parts by weight, or 1.0 part by weight to 1.5 parts by weight, based on 100 parts by weight of the urethane-based prepolymer.

Alternatively, the solid phase foaming agent may be employed in an amount of 0.5 part by weight to 2.7 parts by weight, 0.8 part by weight to 2.6 parts by weight, or 1.5 parts by weight to 3 parts by weight, based on 100 parts by weight of the urethane-based prepolymer.

The solid phase foaming agent may be a fine hollow particle having a shell.

The glass transition temperature (Tg) of the shell may be 70° C. to 110 C, 80° C. to 110° C., 90° C. to 110° C., 100° C. to 110° C., 70° C. to 100° C., 70° C. to 90° C., or 80° C. to 100° C. If the glass transition temperature of the shell of the solid phase foaming agent is within the above preferred range, the pore distribution of the polishing surface within the above target range can be achieved by applying an appropriate pressure and a charge condition during the process for preparing a polishing pad to prevent the deformation of micropores.

According to an embodiment of the present invention, it is possible to control the size (diameter) and size distribution of pores having the above characteristics by using a solid phase foaming agent alone, without a gas phase foaming agent, as a foaming agent. In particular, it is possible to control the size distribution of pores as desired in the present invention by adjusting the type and content of the solid phase foaming agent and/or the charge rate and vacuum degree when the composition is charged and injected into a mold.

Gas Phase Foaming Agent

The gas phase foaming agent may comprise an inert gas. The gas phase foaming agent is fed when the urethane-based prepolymer, the curing agent, the solid phase foaming agent, the reaction rate controlling agent, and the silicone-based surfactant are mixed and reacted, to thereby form pores. The kind of the inert gas is not particularly limited as long as it is a gas that does not participate in the reaction between the prepolymer and the curing agent. For example, the inert gas may be at least one selected from the group consisting of nitrogen gas ($N_2$), argon gas (Ar), and helium gas (He). Specifically, the inert gas may be nitrogen gas ($N_2$) or argon gas (Ar).

The inert gas may be fed in a volume of 5% to 30% based on the total volume of the composition (i.e., the mixture of raw materials), specifically the total volume of the urethane-based prepolymer, the foaming agent, the reaction rate controlling agent, the curing agent, and/or the surfactant.

Specifically, the inert gas may be fed in a volume of greater than 5% by volume to 20% by volume, greater than 5% by volume to 18% by volume, specifically 6% by volume to 15% by volume, more specifically 6% by volume to 13% by volume, or 7.5% by volume to 10% by volume, based on the total volume of the composition.

Alternatively, the inert gas may be fed in a volume of 6% by volume to 25% by volume, specifically 8% by volume to 25% by volume, based on the total volume of the composition.

Reaction Rate Controlling Agent

According to an embodiment of the present invention, the composition may comprise a reaction rate controlling agent.

The reaction rate controlling agent may be a reaction promoter or a reaction retarder. Specifically, the reaction rate controlling agent may be a reaction promoter. For example, it may be at least one reaction promoter selected from the group consisting of a tertiary amine-based compound and an organometallic compound.

Specifically, the reaction rate controlling agent may comprise at least one selected from the group consisting of triethylenediamine, dimethylethanolamine, tetramethylbutanediamine, 2-methyl-triethylenediamine, dimethylcyclohexylamine, triethylamine, triisopropanolamine, 1,4-diazabicyclo(2,2,2)octane, bis(2-methylaminoethyl) ether, trimethylaminoethylethanolamine, N,N,N,N,N"-pentamethyldiethylenetriamine, dimethylaminoethylamine, dimethylaminopropylamine, benzyldimethylamine, N-ethylmorpholine, N,N-dimethylaminoethylmorpholine, N,N-dimethylcyclohexylamine, 2-methyl-2-azanorbornane, dibutyltin dilaurate, stannous octoate, dibutyltin diacetate, dioctyltin diacetate, dibutyltin maleate, dibutyltin di-2-ethylhexanoate, and dibutyltin dimercaptide. Specifically, the reaction rate controlling agent may comprise at least one selected from the group consisting of benzyldimethylamine, N,N-dimethylcyclohexylamine, and triethylamine.

The reaction rate controlling agent may be employed in an amount of 0.05 part by weight to 2 parts by weight based on 100 parts by weight of the urethane-based prepolymer.

Specifically, the reaction rate controlling agent may be employed in an amount of greater than 0.1 part by weight to 2 parts by weight, greater than 0.1 part by weight to 1.8 parts by weight, specifically 0.3 part by weight to 1.8 parts by weight, more specifically greater than 0.3 part by weight to less than 1.8 parts by weight, or 0.5 part by weight to 1.5 parts by weight, based on 100 parts by weight of the urethane-based prepolymer.

The reaction rate controlling agent may be employed in an amount of 0.05 part by weight to 1.8 parts by weight, 0.05 part by weight to 1.7 parts by weight, 0.05 part by weight to 1.6 parts by weight, 0.1 part by weight to 1.5 parts by weight, 0.1 part by weight to 0.3 part by weight, 0.2 part by weight to 1.8 parts by weight, 0.2 part by weight to 1.7 parts by weight, 0.2 part by weight to 1.6 parts by weight, 0.2 part by weight to 1.5 parts by weight, or 0.5 part by weight to 1 part by weight, based on 100 parts by weight of the urethane-based prepolymer.

If the reaction rate controlling agent is employed in an amount within the above range, the reaction rate (i.e., the time for solidification of the mixture) of the mixture (e.g., the urethane-based prepolymer, the curing agent, the solid phase foaming agent, the reaction rate controlling agent, and the silicone-based surfactant) is properly controlled, whereby pores of a desired size can be formed.

Surfactant

According to an embodiment of the present invention, the composition may comprise a surfactant. The surfactant may act to prevent the pores to be formed from overlapping and coalescing with each other. The kind of the surfactant is not particularly limited as long as it is commonly used in the production of a polishing pad. For example, the surfactant may comprise a silicone-based surfactant. Examples of the commercially available silicone-based surfactant include B8749LF, B8736LF2, and B8734LF2 manufactured by Evonik.

The silicone-based surfactant may be employed in an amount of 0.2 part by weight to 2 parts by weight based on 100 parts by weight of the urethane-based prepolymer. Specifically, the silicone-based surfactant may be employed in an amount of 0.2 part by weight to 1.9 parts by weight, 0.2 part by weight to 1.8 parts by weight, 0.2 part by weight to 1.7 parts by weight, 0.2 part by weight to 1.6 parts by weight, 0.2 part by weight to 1.5 parts, or 0.5 part by weight to 1.5 parts by weight, based on 100 parts by weight of the urethane-based prepolymer. If the silicone-based surfactant is employed in an amount within the above range, the pores to be derived from the gas phase foaming agent can be stably formed and maintained in the mold.

Reaction and Formation of Pores

The urethane-based prepolymer and the curing agent react with each other upon the mixing thereof to form a solid polyurethane, which is then formed into a sheet or the like. Specifically, the isocyanate terminal group in the urethane-based prepolymer can react with the amine group, the alcohol group, and the like in the curing agent. In such event, the gas phase foaming agent comprising an inert gas and the solid phase foaming agent are uniformly dispersed in the raw materials to physically form a pore structure without participating in the chemical reaction between the urethane-based prepolymer and the curing agent.

The pore structure of the polishing pad may be determined as a change in the size of the solid phase foaming agent is caused by the pressure and/or charge conditions in the process for preparing a polishing pad, or as pores by an external gas penetrate into the pore structure formed by the solid phase foaming agent.

Meanwhile, in the case where a gas phase foaming agent is used, the gas phase foaming agent comprising an inert gas is also uniformly dispersed in the raw materials without participating in the reaction of the urethane-based prepolymer and the curing agent to form pores, and the size of the pore structure by the gas phase foaming agent is adjusted by the pressure and/or charge conditions in the process for preparing a polishing pad, which may have an impact on the pore structure of the polishing pad.

In addition, in the case where a reaction rate controlling agent is used, the reaction rate controlling agent adjusts the size of the pores by promoting or retarding the reaction between the urethane-based prepolymer and the curing agent. For example, if the reaction rate controlling agent is a reaction retarder for delaying the reaction, the time for which the inert gas finely dispersed in the raw materials are combined with each other is prolonged, so that the average diameter of the pores can be increased. On the other hand, if the reaction rate controlling agent is a reaction promoter for expediting the reaction, the time for which the inert gas finely dispersed in the raw materials are combined with each other is shortened, so that the average diameter of the pores can be reduced.

Meanwhile, the process for preparing a polishing pad according to an embodiment of the present invention may comprise charging and injecting the composition into a mold under a predetermined pressure, or a reduced pressure, condition to form a polishing layer (step 2).

The pressure, or reduced pressure, condition in the mold is adjusted, thereby adjusting the pore diameters, the number average diameter of the plurality of pores, the total number of pores per unit area, and the total area of the pores. Thus, it is possible to control the specific values of the $D_q$, $D_{sk}$, and $D_{ku}$ and/or the number average diameter ($D_a$) of the plurality of pores and the pores having a diameter greater than the number average diameter of the plurality of pores by at least 200%, whereby the polishing performance such as polishing rate and within-wafer non-uniformity can be enhanced.

In particular, the abnormal pores having a diameter greater than the number average diameter of the plurality of pores by at least 200% may be unintentionally formed due to the instability of the process. According to an embodiment of the present invention, the abnormal pores can be adjusted to an appropriate range by controlling the incorporation of air or bubbles through high-pressure injection and discharge by depressurization, whereby the performance of the polishing pad can be further enhanced.

Molding

FIG. 2 is a schematic diagram showing a molding process using a mold according to an embodiment of the present invention.

Referring to FIG. 2, the molding may be carried out using a mold (100). Specifically, the raw materials (i.e., composition) sufficiently stirred in a mixing head or the like may be charged (b) into the mold to fill the inside thereof. In such event, the charge rate may be adjusted, which may affect the controlling of the abnormal pores. In addition, the abnormal pores can be adjusted to an appropriate range by controlling the incorporation of air or bubbles through high-pressure injection and discharge (a) by depressurization, whereby the performance of the polishing pad can be further enhanced.

The charge rate at the time of the charge (b) and injection may be 5 kg/min to 20 kg/min, specifically 8 kg/min to 18 kg/min, more specifically 8 kg/min to 15 kg/min or 10 kg/min to 12 kg/min. If the charge rate exceeds the above range, a load is applied a lot, which may cause a problem in the process. If the charge rate is less than the above range, the reaction between the urethane-based prepolymer and the curing agent is carried out quickly, so that the polymer is hardened too readily.

In addition, the degree of vacuum at the time of the discharge (a) by depressurization may be carried out in a range of 0.6 kgf/cm² to less than 1 kgf/cm², specifically 0.6 kgf/cm² to 0.9 kgf/cm², more specifically 0.7 kgf/cm² to 0.9 kgf/cm². The degree of vacuum may play an important role in controlling the pore diameters. That is, the depressurization step discharges air and bubbles capable of generating large pores, thereby controlling the area ratio ($A_u$ (%)) of the abnormal pores having a diameter greater than the number average diameter of the plurality of pores by at least 200%. Thus, the depressurization is carried out at a degree of vacuum within the above range, $A_u$ (%) can be controlled to an area ratio of 0.9% to less than 12%. If the degree of vacuum exceeds the above range, $A_u$ (%) increases and $A_n$ (%) relatively decreases, so that the initial polishing rate when a tungsten layer is polished may be excessively increased, and the initial polishing rate when an oxide layer is polished may be excessively decreased. In addition, the polishing performance may not be uniform, and the within-wafer non-uniformity for a tungsten layer and an oxide layer may be deteriorated. In addition, if the degree of vacuum is less than the above range, $A_u$ (%) decreases, so that the initial polishing rate when a tungsten layer is polished may be excessively decreased, and the initial polishing rate when an oxide layer is polished may be excessively increased. In addition, the polishing performance may not be uniform, and the within-wafer non-uniformity for a tungsten layer and an oxide layer may be deteriorated.

In addition, the pressure in the mold may be adjusted to 0.6 kgf/cm² to 1.2 kgf/cm². In addition, the pressure in the mold may be 0.8 kgf/cm² to 1.1 kgf/cm², 0.8 kgf/cm² to 1.0 kgf/cm², 0.6 kgf/cm² to 1.0 kgf/cm², 1.0 kgf/cm² to 1.2 kgf/cm², or 0.9 kgf/cm² to 1.1 kgf/cm². In addition, the pressure in the mold may be, for example, carried out under the condition of 1 kgf/cm².

If the pressure is less than 0.6 kgf/cm², the $D_q$ value may be excessively increased. If the pressure exceeds 1.2 kgf/cm², the number average diameter of pores may be excessively decreased. As a result, $D_q$, $D_{sk}$, and $D_{ku}$ may be affected. Further, the polishing characteristics such as polishing rate and within-wafer non-uniformity may vary.

The reaction between the urethane-based prepolymer and the curing agent is completed in the mold to thereby produce a molded body in the form of a solidified cake that conforms to the shape of the mold.

Thereafter, the molded body thus obtained may be appropriately sliced or cut into a polishing layer for the production of a polishing pad. As an example, a molded body is produced in a mold having a height of 5 to 50 times the thickness of a polishing pad to be finally produced and is then sliced in the same thickness to produce a plurality of sheets for the polishing pads at a time. In such event, a reaction retarder may be used as a reaction rate controlling agent in order to secure a sufficient solidification time. Thus, the height of the mold may be about 5 to about 50 times the thickness of the polishing pad to be finally produced to prepare polishing layers therefor. However, the polishing layers may have pores of different diameters depending on the molded location inside the mold. That is, a polishing layer molded at the lower position of the mold has pores of a fine diameter, whereas a polishing layer molded at the upper position of the mold may have pores of a larger diameter than that of the polishing layer formed at the lower position.

In addition, it is preferable to use a mold capable of, for example, producing one sheet by one molding in order for each polishing layer or sheet to have pores of a uniform diameter. To this end, the height of the mold may not significantly differ from the thickness of the polishing pad to be finally produced. For example, the molding may be carried out using a mold having a height of 1 to 3 times the thickness of the polishing pad to be finally produced. More specifically, the mold may have a height of 1.1 to 2.5 times, or 1.2 to 2 times, the thickness of the polishing pad to be finally produced. In such event, a reaction promoter may be used as the reaction rate controlling agent to form pores having a more uniform diameter.

Thereafter, the top and bottom ends of the molded body obtained from the mold may be cut out, respectively. For example, each of the top and bottom ends of the molded body may be cut out by ⅓ or less, 1/22 to 3/10, or 1/12 to ¼ of the total thickness of the molded body.

As a specific example, the molding is carried out using a mold having a height of 1.2 to 2 times the thickness of the polishing pad to be finally produced, and a further step of cutting out each of the top and bottom ends of the molded body obtained from the mold upon the molding by 1/12 to ¼ of the total thickness of the molded body may then be carried out.

Subsequent to the above cutting step, the above preparation process may further comprise the steps of machining grooves on the surface of the molded body, bonding with the lower part, inspection, packaging, and the like. These steps may be carried out in a conventional manner for preparing a polishing pad.

Physical Properties of the Polishing Pad

As described above, if the total area of pores per unit area and the pore distribution parameters including $D_q$, $D_{sk}$, and $D_{ku}$ of Equations 1 to 3 in the polishing pad according to an embodiment are within the above ranges, the polishing performance such as polishing rate and within-wafer non-uniformity can be remarkably enhanced.

Alternatively, if $D_q$ and $A_u$ (%) in the polishing pad according to an embodiment are within the above ranges, it is possible to achieve uniform polishing performance, whereby the polishing rate and within-wafer non-uniformity of the polishing pad can be remarkably enhanced.

Alternatively, if the polishing pad according to an embodiment satisfies all of the above physical properties, the performance of the polishing pad can be further enhanced.

The polishing pad may have a total number of pores of 600 or more per unit area ($mm^2$) of the polishing pad. More specifically, the total number of pores may be 700 or more, 750 or more, or 800 or more, per unit area ($mm^2$) of the polishing pad. In addition, the total number of pores may be 900 or more per unit area ($mm^2$) of the polishing pad, but it is not limited thereto. In addition, the total number of pores may be 2,500 or less, specifically 2,200 or less, 1,500 or less, or 1,200 or less, per unit area ($mm^2$) of the polishing pad, but it is not limited thereto. Thus, the total number of pores may be 700 to 2,500, for example, 750 to 2,200, 800 to 1,500, or 800 to 1,200, per unit area ($mm^2$) of the polishing pad, but it is not limited thereto.

Specifically, the polishing pad may have an elastic modulus of 60 kgf/$cm^2$ or more. More specifically, the polishing pad may have an elastic modulus of 100 kgf/$cm^2$ or more, but it is not limited thereto. The upper limit of the elastic modulus of the polishing pad may be 150 kgf/$cm^2$, but it is not limited thereto.

In addition, the polishing pad according to an embodiment may be excellent in polishing performance, as well as basic physical properties of a polishing pad such as breakdown voltage, specific gravity, surface hardness, tensile strength, and elongation.

The physical properties of the polishing pad such as specific gravity and hardness can be controlled through the molecular structure of the urethane-based prepolymer polymerized by the reaction between an isocyanate and a polyol.

Specifically, the polishing pad may have a hardness of 30 Shore D to 80 Shore D. More specifically, the polishing pad may have a hardness of 40 Shore D to 70 Shore D, but it is not limited thereto.

Specifically, the polishing pad may have a specific gravity of 0.6 g/$cm^3$ to 0.9 g/$cm^3$. More specifically, the polishing pad may have a specific gravity of 0.7 g/$cm^3$ to 0.85 g/$cm^3$, but it is not limited thereto.

Specifically, the polishing pad may have a tensile strength of 10 N/$mm^2$ to 100 N/$mm^2$. More specifically, the polishing pad may have a tensile strength of 15 N/$mm^2$ to 70 N/$mm^2$. Even more specifically, the polishing pad may have a tensile strength of 20 N/$mm^2$ to 70 N/$mm^2$, but it is not limited thereto.

Specifically, the polishing pad may have an elongation of 30% to 300%. More specifically, the polishing pad may have an elongation of 50% to 200%.

The polishing pad may have a breakdown voltage of 14 kV to 23 kV, a thickness of 1.5 mm to 2.5 mm, a specific gravity of 0.7 g/$cm^3$ to 0.9 g/cm 3, a surface hardness at 25° C. of 50 shore D to 65 shore D, a tensile strength of 15 N/$mm^2$ to 25 N/$mm^2$, and an elongation of 80% to 250%, but it is not limited thereto.

The polishing pad may have a thickness of 1 mm to 5 mm. Specifically, the polishing pad may have a thickness of 1 mm to 3 mm, 1 mm to 2.5 mm, 1.5 mm to 5 mm, 1.5 mm to 3 mm, 1.5 mm to 2.5 mm, 1.8 mm to 5 mm, 1.8 mm to 3 mm, or 1.8 mm to 2.5 mm. If the thickness of the polishing pad is within the above range, the basic physical properties as a polishing pad can be sufficiently exhibited.

The polishing pad may have grooves on its surface for mechanical polishing. The grooves may have a depth, a width, and a spacing as desired for mechanical polishing, which are not particularly limited.

The polishing pad according to an embodiment may simultaneously have the physical properties of the polishing pad as described above.

[Process for Preparing a Semiconductor Device]

The process for preparing a semiconductor device according to an embodiment comprises polishing the surface of a semiconductor substrate using the polishing pad according to an embodiment.

That is, the process for preparing a semiconductor device according to an embodiment comprises mounting a polishing pad comprising a polishing layer comprising a plurality of pores on a platen; and relatively rotating the polishing surface of the polishing layer and the surface of a wafer while they are in contact with each other to polish the surface of the wafer, wherein the total area of the pores per unit area ($mm^2$) of the polishing surface of the polishing layer is 40% to 60%, the $D_q$ value represented by the above Equation 1 is 5 μm to 15 μm, the $D_{sk}$ value represented by the above Equation 2 is greater than 0.3 to less than 1, and the $D_{ku}$ value represented by the above Equation 3 is greater than 1 to less than 5.

The process for preparing a semiconductor device according to another embodiment comprises mounting a polishing pad comprising a polishing layer comprising a plurality of pores on a platen; and relatively rotating the polishing surface of the polishing layer and the surface of a wafer while they are in contact with each other to polish the surface of the wafer, wherein, in the diameter distribution of the plurality of pores based on the polishing surface, the number average diameter ($D_a$) of the plurality of pores is 15 μm to 50 μm, and the pores ($A_u$) having a diameter greater than the number average diameter of the plurality of pores by at least 200% are contained at an area ratio of 0.9% to less than 12% of the total area of the polishing surface.

The process for preparing a semiconductor device according to another embodiment comprises mounting a polishing pad comprising a polishing layer comprising a plurality of pores on a platen; and relatively rotating the polishing surface of the polishing layer and the surface of a wafer while they are in contact with each other to polish the surface of the wafer, wherein the pore distribution represented by $D_q$, $D_{sk}$, and $D_{ku}$ of Equations 1 to 3 is satisfied, and the pores having a diameter greater than the number average diameter ($D_a$) of the plurality of pores by at least 200% are controlled to the above range.

FIG. 1 schematically illustrates the process for preparing a semiconductor device according to an embodiment. Referring to FIG. 1, once the polishing pad (110) according to an embodiment is attached to a platen (120), a semiconductor substrate (130) is disposed on the polishing pad (110). In such event, the surface of the semiconductor substrate (130) is in direct contact with the polishing surface of the polishing pad (110). A polishing slurry (150) may be sprayed through a nozzle (140) on the polishing pad for polishing. The flow rate of the polishing slurry (150) supplied through the nozzle (140) may be selected according to the purpose within a range of about 10 cm³/min to about 1,000 cm³/min. For example, it may be about 50 cm³/min to about 500 cm³/min, but it is not limited thereto.

Thereafter, the semiconductor substrate (130) and the polishing pad (110) rotate relatively to each other, so that the surface of the semiconductor substrate (130) is polished. In such event, the rotation direction of the semiconductor substrate (130) and the rotation direction of the polishing pad (110) may be the same direction or opposite directions. The rotation speeds of the semiconductor substrate (130) and the polishing pad (110) may be selected according to the purpose within a range of about 10 rpm to about 500 rpm. For example, it may be about 30 rpm to about 200 rpm, but it is not limited thereto.

The semiconductor substrate (130) mounted on the polishing head (160) is pressed against the polishing surface of the polishing pad (110) at a predetermined load to be in contact therewith, the surface thereof may then be polished. The load applied to the polishing surface of the polishing pad (110) through the surface of the semiconductor substrate (130) by the polishing head (160) may be selected according to the purpose within a range of about 1 gf/cm² to about 1,000 gf/cm². For example, it may be about 10 gf/cm² to about 800 gf/cm², but it is not limited thereto.

In an embodiment, in order to maintain the polishing surface of the polishing pad (110) in a state suitable for polishing, the process for preparing a semiconductor device may further comprise processing the polishing surface of the polishing pad (110) with a conditioner (170) simultaneously with polishing the semiconductor substrate (130).

According to the embodiment, the size (or diameter) and distribution of the plurality of pores contained in the polishing pad can be adjusted. As a result, in the polishing pad, the total area of pores per unit area and the pore distribution represented by $D_q$, $D_{sk}$, and $D_{ku}$ of Equations 1 to 3 have values in certain ranges, or the number average diameter ($D_a$) of the plurality of pores and the pores having a diameter greater than the number average diameter of the plurality of pores by at least 200% are controlled, whereby the polishing performance such as polishing rate and within-wafer non-uniformity can be further enhanced. In addition, it is possible to efficiently fabricate a semiconductor device of excellent quality using the polishing pad.

EMBODIMENTS FOR CARRYING OUT THE INVENTION

Hereinafter, the present invention will be described in detail with reference to examples. These examples are set forth to illustrate the present invention, and the scope of the present invention is not limited thereto.

Example 1-1

In a casting machine equipped with feeding lines for a urethane-based prepolymer, a curing agent, an inert gas, and a reaction rate controlling agent, PUGL-550D (SKC) having an unreacted NCO content of 9.1% by weight was charged to the prepolymer tank, and 4,4'-methylenebis(2-chloroaniline) (MOCA; Ishihara) was charged to the curing agent tank. Nitrogen ($N_2$) as an inert gas and a reaction promoter (a tertiary amine compound; manufacturer: Air Products, product name: A1) as a reaction rate controlling agent were prepared. In addition, 1 part by weight of a solid phase foaming agent (manufacturer: AkzoNobel, product name: Expancel 461 DET 20 d40, average particle size: 20 μm) and 1 part by weight of a silicone-based surfactant (manufacturer: Evonik, product name: B8462) were mixed in advance based on 100 parts by weight of the urethane-based prepolymer and then charged into the prepolymer tank.

The urethane-based prepolymer, the curing agent, the solid phase foaming agent, the reaction rate controlling agent, the silicone-based surfactant, and the inert gas were stirred while they were fed to the mixing head at constant rates through the respective feeding lines. In such event, the molar equivalent ratio of the NCO group in the urethane-based prepolymer to the reactive groups in the curing agent was adjusted to 1:1, and the total feed rate was maintained at a rate of 10 kg/min. In addition, the inert gas was constantly fed in a volume of 10% based on the total volume of the urethane-based prepolymer, the curing agent, the solid phase foaming agent, the reaction rate controlling agent, and the silicone-based surfactant. The reaction rate controlling agent was fed in an amount of 0.5 part by weight based on 100 parts by weight of the urethane-based prepolymer.

The stirred raw material was charged to a mold (1,000 mm in length, 1,000 mm in width, and 3 mm in height) under the conditions of a charge rate of 10 kg/min and a pressure in the mold adjusted to 1.0 kgf/cm². Upon completion of the reaction, a porous polyurethane molded body was obtained. Thereafter, the surface of the porous polyurethane molded body was ground using a grinder and then grooved using a tip, so that the average thickness thereof was adjusted to 2 mm.

The porous polyurethane layer and a substrate layer (average thickness: 1.1 mm) were thermally bonded at 120° C. with a hot-melt film (manufacturer: SKC, product name: TF-00) to produce a polishing pad.

Example 1-2

A polishing pad was prepared in the same manner as in Example 1-1, except that the contents of the reaction rate controlling agent, the gas phase foaming agent, and the solid phase foaming agent were adjusted as shown in Table 1 below.

Example 1-3

In the casting machine of Example 1-1, the feeding lines for the inert gas and the reaction rate controlling agent were cut off. PUGL-600D (manufactured by SKC with a weight average molecular weight of 1,500 g/mole) having an NCO content of 9.1% was charged to the prepolymer tank, and 4,4'-methylenebis(2-chloroaniline) (manufactured by TCI (Tokyo Chemical Industry)) was charged to the curing agent tank.

Furthermore, 1.5 parts by weight of a solid phase foaming agent (manufactured by AkzoNobel under the brand name of Expancel 461 DET 20 d40 with an average particle diameter of 40 μm) was mixed in advance based on 100 parts by weight of the urethane-based prepolymer, which was charged to the prepolymer tank.

The urethane-based prepolymer mixed with the solid phase foaming agent and the curing agent were stirred while they were fed to the mixing head at constant rates through the respective feeding lines. The rotation speed of the mixing head was about 5,000 rpm. In such event, the molar equivalent ratio of the NCO group in the urethane-based prepolymer to the reactive groups in the curing agent was adjusted to 1:1, and the total feed rate was maintained at a rate of 10 kg/min.

The stirred raw material was charged to a mold (1,000 mm in length, 1,000 mm in width, and 3 mm in height) under the conditions of a charge rate of 10 kg/min and a pressure in the mold adjusted to 0.8 kgf/cm$^2$. Upon completion of the reaction, a porous polyurethane molded body was obtained. Thereafter, the surface of the porous polyurethane molded body was ground using a grinder and then grooved using a tip, so that the average thickness thereof was adjusted to 2 mm.

The porous polyurethane layer and a substrate layer (average thickness: 1.1 mm) were thermally bonded at 120° C. with a hot-melt film (manufacturer: SKC, product name: TF-00) to produce a polishing pad.

Example 1-4

A polishing pad was prepared in the same manner as in Example 1-3, except that the content of the solid phase foaming agent and the degree of vacuum in the mold were adjusted as shown in Table 1 below.

Example 2-1

In a casting machine equipped with feeding lines for a urethane-based prepolymer, a curing agent, an inert gas, and a reaction rate controlling agent, PUGL-600D (manufactured by SKC with a weight average molecular weight of 1,500 g/mole) having an NCO content of 9.1% was charged to the prepolymer tank, 4,4'-methylenebis(2-chloroaniline) (manufactured by TCI (Tokyo Chemical Industry)) was charged to the curing agent tank, and nitrogen (N$_2$) was prepared as an inert gas. In addition, triethylenediamine (TEDA) supplied by Sigma Aldrich Corporation was employed as a reaction rate controlling agent.

Furthermore, 1 part by weight of a solid phase foaming agent (manufactured by AkzoNobel under the brand name of Expancel 461 DET 20 d40 with an average particle diameter of 40 μm) and 0.5 part by weight of a silicone surfactant (manufactured by Evonik Industries under the brand name of B8462) were mixed in advance based on 100 parts by weight of the urethane-based prepolymer and then charged into the prepolymer tank.

The urethane-based prepolymer, the curing agent, the solid phase foaming agent, the reaction rate controlling agent, and the inert gas were stirred while they were fed to the mixing head at constant rates through the respective feeding lines. The rotation speed of the mixing head was about 5,000 rpm. In such event, the molar equivalent ratio of the NCO group in the urethane-based prepolymer to the reactive groups in the curing agent was adjusted to 1:1, and the total feed rate was maintained at a rate of 10 kg/min. In addition, the inert gas was fed in a volume of 21% based on the total volume of the urethane-based prepolymer, the curing agent, the solid phase foaming agent, the reaction promoter, and the silicone surfactant with a target specific gravity of a polyurethane sheet of 0.8 g/cm$^3$. The reaction rate controlling agent was fed in an amount of 0.5 part by weight based on 100 parts by weight of the urethane-based prepolymer.

The stirred raw material was charged to a mold (1,000 mm in length, 1,000 mm in width, and 3 mm in height) under the conditions of a charge rate of 10 kg/min and a degree of vacuum in the mold of 0.8 kgf/cm$^2$. Upon completion of the reaction, a molded body in the form of a sold cake was obtained. Thereafter, the top and bottom of the molded body were each ground by a thickness of 0.5 mm to obtain an upper pad having a thickness to 2 mm.

Thereafter, the upper pad was subjected to surface milling and groove forming steps and laminated with a lower pad by a hot melt adhesive, thereby preparing a polishing pad.

Example 2-2

A polishing pad was prepared in the same manner as in Example 2-1, except that the charge rate was adjusted to 12 kg/min as shown in Table 2 below.

Example 2-3

A polishing pad was prepared in the same manner as in Example 2-1, except that the charge rate was adjusted to 12 kg/min and the degree of vacuum was adjusted to 0.7 kgf/cm$^2$ as shown in Table 2 below.

Example 2-4

A polishing pad was prepared in the same manner as in Example 2-1, except that the charge rate was adjusted to 10 kg/min and the degree of vacuum was adjusted to 0.9 kgf/cm$^2$ as shown in Table 2 below.

Example 2-5

In the casting machine of Example 2-1, the feeding lines for the inert gas and the reaction rate controlling agent were cut off. PUGL-600D (manufactured by SKC with a weight average molecular weight of 1,500 g/mole) having an NCO content of 9.1% was charged to the prepolymer tank, and 4,4'-methylenebis(2-chloroaniline) (manufactured by TCI (Tokyo Chemical Industry)) was charged to the curing agent tank.

Furthermore, 1.5 parts by weight of a solid phase foaming agent (manufactured by AkzoNobel under the brand name of Expancel 461 DET 20 d40 with an average particle diameter of 40 μm) was mixed in advance based on 100 parts by weight of the urethane-based prepolymer, which was charged to the prepolymer tank.

The urethane-based prepolymer mixed with the solid phase foaming agent and the curing agent were stirred while they were fed to the mixing head at constant rates through the respective feeding lines. The rotation speed of the mixing head was about 5,000 rpm. In such event, the molar equivalent ratio of the NCO group in the urethane-based prepolymer to the reactive groups in the curing agent was adjusted to 1:1, and the total feed rate was maintained at a rate of 10 kg/min.

The stirred raw material was charged to a mold (1,000 mm in length, 1,000 mm in width, and 3 mm in height) under the conditions of a charge rate of 10 kg/min and a degree of vacuum in the mold of 0.8 kgf/cm². Upon completion of the reaction, a molded body in the form of a sold cake was obtained. Thereafter, the top and bottom of the molded article were each ground by a thickness of 0.5 mm to obtain an upper pad having a thickness to 2 mm.

Thereafter, the upper pad was subjected to surface milling and groove forming steps and laminated with a lower pad by a hot melt adhesive, thereby preparing a polishing pad.

Comparative Examples 1-1 to 1-8

A polishing pad was prepared in the same manner as in Example 1-1, except that the degree of vacuum in the mold and the contents of the reaction rate controlling agent, the gas phase foaming agent, and the solid phase foaming agent were adjusted as shown in Table 1 below.

Comparative Examples 1-9 and 1-10

A polishing pad was prepared in the same manner as in Example 1-3, except that the content of the solid phase foaming agent and the degree of vacuum in the mold were adjusted as shown in Table 1 below.

Comparative Examples 2-1

A polishing pad was prepared in the same manner as in Example 2-1, except that the degree of vacuum was adjusted to atmospheric pressure as shown in Table 2 below.

Comparative Examples 2-2

A polishing pad was prepared in the same manner as in Example 2-5, except that the charge rate was adjusted to 12 kg/min and the degree of vacuum was adjusted to 0.5 kgf/cm² as shown in Table 2 below.

Comparative Examples 2-3

A polishing pad was prepared in the same manner as in Example 2-5, except that the degree of vacuum was adjusted to atmospheric pressure as shown in Table 2 below.

Test Example (1) Characteristics of Pores
<Number Average Diameter of a Plurality of Pores and Total Area of Pores Per Unit Area>

The polishing pad was cut into a square of 1 mm×1 mm (thickness: 2 mm), and the cross-section of the polishing surface cut to 1 mm² was observed with a scanning electron microscope (SEM) from the image magnified 100 times.

The diameters of the entire pores were measured from the image obtained using an image analysis software, from which the average pore diameter, the distribution of the sums of the cross-sectional areas of pores by pore diameter, the number of pores, and the total area of pores were obtained.

Ratio of the sums of the cross-sectional areas of pores: the pores obtained from the SEM image were classified in 1 μm units.

Number average diameter ($D_a$): an average value obtained by dividing the sum of the diameters of the plurality of pores on 1 mm² of the polishing surface by the number of pores Number of pores: the number of total pores per unit area (mm²) on the SEM image Total area of pores per unit area (mm²): percentage of the area of the pores relative to the total area of the SEM image FIGS. 3 and 4 are a scanning electron microscope (SEM) image of pores of the polishing pad of Example 1-1 and an image magnified by 100 times using SEM of the polishing surface of 1 mm² of the polishing pad of Example 1-1, respectively. As can be seen from FIGS. 3 and 4, the polishing pad of Example 1-1 showed a uniform pore distribution.

In the polishing pad of Example 2-1, the pores having a diameter greater than the number average diameter of the plurality of pores by at least 200% were controlled, similar to FIGS. 3 and 4, showing a uniform pore distribution.

<Area Ratio ($A_u$ (%)) of the Pores ($A_u$) Having a Diameter Greater than the Number Average Diameter of a Plurality of Pores by at Least 200%>

$A_u$ (%) may be calculated by the following Equation 4:

$$A_u \% = \frac{A_u(\mu m^2)}{A_t(\mu m^2)} \times 100(\%) \qquad \text{[Equation 4]}$$

In Equation 4, $A_t(\mu m^2)$ is the total measurement area, and $A_u$ ($\mu m^2$) is the area of pores having a diameter greater than the number average diameter of a plurality of pores by at least 200%.

<Total Area Ratio ($A_p$ (%)) of a Plurality of Pores>
$A_p$ (%) may be calculated by the following Equation 6:

$$A_u \% = \frac{A_u(\mu m^2)}{A_t(\mu m^2)} \times 100(\%) \qquad \text{[Equation 4]}$$

In Equation 6, $A_t(\mu m^2)$ is the total measurement area, and $A_p$ ($\mu m^2$) is the total area of the plurality of pores.

<Area Ratio ($A_n$ (%)) of the Pores ($A_n$) Other than the Pores Having a Diameter Greater than the Number Average Diameter of a Plurality of Pores by at Least 200%.

$A_n$ (%) may be calculated by the following Equation 7:

$$A_n \% = \frac{A_n(\mu m^2)}{A_t(\mu m^2)} \times 100(\%) \qquad \text{[Equation 7]}$$

In Equation 7, $A_t(\mu m^2)$ is the total measurement area, and $A_n$ ($\mu m^2$) is the area of the pores other than the pores having a diameter greater than the number average diameter of a plurality of pores by at least 200%.

(2) Polishing Rates for a Tungsten Layer and an Oxide Layer

A silicon wafer having a size of 300 mm with a tungsten (W) layer formed by a CVD process was set in a CMP polishing machine. The silicon wafer was set on the polishing pad mounted on the platen, while the tungsten layer of the silicon wafer faced downward. Thereafter, the tungsten layer was polished under a polishing load of 2.8 psi while the platen was rotated at a speed of 115 rpm for 30 seconds and a calcined silica slurry was supplied onto the polishing pad at a rate of 190 ml/min. Upon completion of the polishing, the silicon wafer was detached from the carrier, mounted in a spin dryer, washed with deionized water (DIW), and then dried with air for 15 seconds. The layer thickness of the dried silicon wafer was measured before and after the polishing using a contact type sheet resistance measuring instrument (with a 4-point probe). Then, the polishing rate was calculated by the following Equation 8.

Polishing rate (Å/min)=difference in thickness before and after polishing (Å)/polishing time (minute)  [Equation 8]

In addition, a silicon wafer having a size of 300 mm with a silicon oxide (SiOx) layer formed by a TEOS-plasma CVD process was used, instead of the silicon wafer with a tungsten layer, in the same device. The silicon wafer was set on the polishing pad mounted on the platen, while the silicon oxide layer of the silicon wafer faced downward. Thereafter, the silicon oxide layer was polished under a polishing load of 1.4 psi while the platen was rotated at a speed of 115 rpm for 60 seconds and a calcined silica slurry was supplied onto the polishing pad at a rate of 190 ml/min. Upon completion of the polishing, the silicon wafer was detached from the carrier, mounted in a spin dryer, washed with deionized water (DIW), and then dried with air for 15 seconds. The difference in film thickness of the dried silicon wafer before and after the polishing was measured using a spectral reflectometer type thickness measuring instrument (manufacturer: Kyence, model: SI-F80R). Then, the polishing rate was calculated by the above Equation 8.

(3) Within-Wafer Non-Uniformity for a Tungsten Layer and an Oxide Layer

The silicon wafer having a tungsten layer and the silicon wafer having a silicon oxide (SiOx) layer prepared in the same manner as in the above Test Example (2) were each coated with 1 μm (10,000 Å) of a thermal oxide layer, which was polished for 1 minute under the conditions as described above. The in-plane film thickness at 98 points of the wafer was measured to calculate the within-wafer non-uniformity (WIWNU) by the following Equation 9:

Within-wafer non-uniformity (WIWNU)(%)=(standard deviation of polished thickness/average polished thickness)×100(%)  [Equation 9]

The properties of the polishing pads prepared in Examples 1-1 to 1-4 and Comparative Examples 1-1 to 1-10 were measured according to the following conditions and procedures. The results are shown in Table 1 below.

TABLE 1

|  |  | Example | | | | Comparative Example | | |
| --- | --- | --- | --- | --- | --- | --- | --- | --- |
|  |  | 1-1 | 1-2 | 1-3 | 1-4 | 1-1 | 1-2 | 1-3 |
| Particle diameter of solid phase foaming agent (μm) | | 32.67 | 34.06 | 34.7 | 33.81 | 31.83 | 33.27 | 32.67 |
| Standard deviation of solid phase foaming agent | | 10.31 | 7.95 | 10.37 | 9.87 | 10.57 | 8.57 | 10.31 |
| Reaction rate controlling agent (part by weight) | | 0.5 | 1.5 | 0.0 | 0.0 | 0.5 | 0.5 | 0.5 |
| Feed rate of gas phase foaming agent (% by volume) | | 10.0 | 7.5 | 0.0 | 0.0 | 5.0 | 5.0 | 10.0 |
| Feed rate of solid phase foaming agent (part by weight) | | 1.0 | 1.5 | 1.5 | 2.0 | 0.5 | 2.5 | 1.0 |
| Vacuum pressure (kgf/cm²) | | 1 | 1 | 0.8 | 1 | 1 | 1 | 1.2 |
| Pore characteristics of a pad | Number average diameter of pores (μm) | 20.74 | 21.52 | 19.5 | 19.32 | 20.43 | 22.54 | 17.57 |
|  | Total area % of pores per unit are (%) | 49.81 | 52.17 | 40.75 | 59.05 | 35.25 | 60.15 | 55.18 |
|  | $D_q$ (μm) | 11.02 | 8.61 | 11.52 | 12.81 | 7.57 | 13.95 | 4.05 |
|  | $D_{sk}$ | 0.87 | 0.49 | 0.80 | 0.98 | 0.35 | 0.97 | 0.37 |
|  | $D_{ku}$ | 4.02 | 3.06 | 4.20 | 4.52 | 2.86 | 4.89 | 1.52 |
| Polishing rate of a pad | Polishing rate for a tungsten layer (Å/min) | 787 | 810 | 750 | 815 | 620 | 950 | 711 |
|  | Within-wafer non-uniformity for a tungsten layer (%) | 4.5 | 3.0 | 3.1 | 3.8 | 3.5 | 12.5 | 3.5 |
|  | Polishing rate for an oxide layer (Å/min) | 2931 | 2950 | 2850 | 3150 | 2215 | 2705 | 3050 |
|  | Within-wafer non-uniformity | 3.8 | 3.7 | 3.7 | 4.5 | 4.2 | 10.8 | 10.2 |

TABLE 1-continued for an oxide layer (%)

|  |  | Comparative Example | | | | | | |
| --- | --- | --- | --- | --- | --- | --- | --- | --- |
|  |  | 1-4 | 1-5 | 1-6 | 1-7 | 1-8 | 1-9 | 1-10 |
| Particle diameter of solid phase foaming agent (μm) | | 32.67 | 31.83 | 31.83 | 33.06 | 33.06 | 33.7 | 33.81 |
| Standard deviation of solid phase foaming agent | | 10.31 | 10.57 | 10.57 | 10.15 | 10.15 | 10.37 | 9.87 |
| Reaction rate controlling agent (part by weight) | | 0.5 | 1.5 | 0.1 | 0.5 | 1.0 | 0.0 | 0.0 |
| Feed rate of gas phase foaming agent (% by volume) | | 10.0 | 10.0 | 10.0 | 1.0 | 30 | 0.0 | 0.0 |
| Feed rate of solid phase foaming agent (part by weight) | | 1.0 | 1.0 | 1.0 | 2.5 | — | 0.5 | 2.5 |
| Vacuum pressure (kgf/cm$^2$) | | 0.8 | 1 | 1 | 1 | 1 | 1 | 1 |
| Pore characteristics of a pad | Number average diameter of pores (μm) | 20.42 | 22.57 | 28.51 | 21.52 | 45.74 | 19.58 | 19.72 |
|  | Total area % of pores per unit are (%) | 50.54 | 58.42 | 57.52 | 57.27 | 59.46 | 30.54 | 60.05 |
|  | $D_q$ (μm) | 15.92 | 5.27 | 14.42 | 14.32 | 14.85 | 4.49 | 4.59 |
|  | $D_{sk}$ | 0.85 | 0.25 | 1.23 | 0.18 | 0.87 | 0.50 | 0.54 |
|  | $D_{ku}$ | 4.98 | 1.50 | 4.90 | 0.84 | 5.51 | 3.57 | 3.79 |
| Polishing rate of a pad | Polishing rate for a tungsten layer (Å/min) | 920 | 701 | 870 | 707 | 932 | 601 | 950 |
|  | Within-wafer non-uniformity for a tungsten layer (%) | 10.5 | 4.8 | 8.5 | 3.5 | 11.1 | 3.5 | 10.8 |
|  | Polishing rate for an oxide layer (Å/min) | 2850 | 2800 | 2815 | 2700 | 2530 | 2235 | 3215 |
|  | Within-wafer non-uniformity for an oxide layer (%) | 7.5 | 4.5 | 9.5 | 4.3 | 9.8 | 5.5 | 10.1 |

As can be seen from Table 1, the polishing pads of Examples 1-1 to 1-4 in which the total area of pores per unit area of the polishing surface and the $D_q$, $D_{sk}$, and $D_{ku}$ values of Equations 1 to 3 fell within the scope of the present invention were remarkably excellent in the polishing rate and within-wafer non-uniformity for a tungsten layer and an oxide layer as compared with those of Comparative Examples 1-1 to 1-10.

Specifically, the polishing pads of Examples 1-1 to 1-4 had a polishing rate of 750 Å/min to 815 Å/min and 2,850 Å/min to 3,150 Å/min for a tungsten layer and an oxide layer, respectively. They also had an excellent within-wafer non-uniformity of 4.5% or less for a tungsten layer and an oxide layer.

In contrast, the polishing pad of Comparative Examples 1-1 in which the total area of pores per unit area of the polishing surface was less than 40% had a polishing rate of 620 Å/min and 2,215 Å/min for a tungsten layer and an oxide layer, respectively, which were significantly lower than those of the polishing pads of Examples 1-1 to 1-4.

On the other hand, the polishing pad of Comparative Examples 1-2 in which the total area of pores per unit area of the polishing surface was greater than 60% had a within-wafer non-uniformity of 12.5% for a tungsten layer, which was significantly lower than that for a tungsten layer of the polishing pad of Example 1-2. Further, the polishing rate when a tungsten layer was polished was 950 Å/min, which was too high as compared with that of the polishing pads of Examples 1-1 to 1-4, whereas the polishing rate for an oxide layer was very low of 2,705 Å/min.

Meanwhile, the polishing pad of Comparative Examples 1-3 in which the $D_q$ value was less than 5 μm had a polishing rate of 711 Å/min when a tungsten layer was polished, which was lower than those of the polishing pads of Examples 1-1 to 1-4, and a within-wafer non-uniformity of 10.2% for an oxide layer, which was remarkably inferior to those of the polishing pads of Examples 1-1 and 1-2.

The polishing pad of Comparative Examples 1-4 in which the $D_q$ value exceeded 15 μm had a polishing rate of 920 Å/min when a tungsten layer was polished, which was significantly greater than those of the polishing pads of Examples 1-1 to 1-4, and a within-wafer non-uniformity of 10.5% and 7.5% for a tungsten layer and an oxide layer, respectively, which were inferior to those of Examples 1-1 to 1-4.

In addition, the polishing pad of Comparative Examples 1-5 in which the $D_{sk}$ value was 0.3 or less had a poor polishing rate when a tungsten layer was polished. The polishing pad of Comparative Examples 1-6 in which the $D_{sk}$ value was 1 or more had an excessively high polishing rate when a tungsten layer was polished and a within-wafer non-uniformity for a tungsten layer and an oxide layer, which was remarkably inferior to those of the polishing pads of Examples 1-1 to 1-4.

Meanwhile, the polishing pad of Comparative Examples 1-7 in which the $D_{ku}$ value was 1 or less had a poor polishing rate when a tungsten layer was polished. The polishing pad of Comparative Examples 1-8 in which the $D_{ku}$ value was 5 or more had remarkably poor properties in terms of polishing rate and within-wafer non-uniformity for a tungsten layer and an oxide layer.

In addition, in the polishing pad of Examples 1-3 and 1-4, the polishing rate and the within-wafer non-uniformity were effectively enhanced by adjusting the vacuum pressure and the feed rate of the solid phase foaming agent even though a reaction rate controlling agent and a gas phase foaming agent were not used.

In contrast, in the polishing pads of Comparative Examples 1-9 and 1-10 in which a reaction rate controlling agent and a gas phase foaming agent were not used as in Examples 1-3 and 1-4, the total area of pores per unit area and the $D_q$ value fell outside the scope of the present invention when the feed rate of the solid phase foaming agent was too small or too large. In this case, the polishing rate and the within-wafer non-uniformity were deteriorated.

Accordingly, if any of the total area of pores per unit area of the polishing surface and the $D_q$, $D_{sk}$, and $D_{ku}$ values of Equations 1 to 3 fell outside the scope of the present invention, it would have a significant impact on the polishing performance such as polishing rate and within-wafer non-uniformity.

The properties of the polishing pads prepared in Examples 2-1 to 2-5 and Comparative Examples 2-1 to 2-3 were measured according to the above conditions and procedures. The results are shown in Table 2 below.

TABLE 2

| | | Example | | | | | Comparative Example | | |
|---|---|---|---|---|---|---|---|---|---|
| | | 2-1 | 2-2 | 2-3 | 2-4 | 2-5 | 2-1 | 2-2 | 2-3 |
| Composition | Foaming agent | Gas + solid | Gas + solid | Gas + solid | Gas + solid | Solid | Gas + solid | Solid | Solid |
| | Surfactant | ○ | ○ | ○ | ○ | × | ○ | × | × |
| | Reaction rate controlling agent | ○ | ○ | ○ | ○ | × | ○ | × | × |
| | Charge rate (kg/min) | 10 | 12 | 12 | 10 | 10 | 10 | 12 | 10 |
| | Degree of vacuum (kgf/cm²) | 0.8 | 0.8 | 0.7 | 0.9 | 0.8 | Atmospheric pressure | 0.5 | Atmospheric pressure |
| Pore characteristics of a pad | $D_a$ (µm) | 20.74 | 21.52 | 18.54 | 24.52 | 15.14 | 31.32 | 14.58 | 14.32 |
| | $A_r$ (µm²) | 326048 | 326048 | 326048 | 326048 | 326048 | 326048 | 326048 | 326048 |
| | $A_p$ (µm²) | 162403 | 171732 | 167653 | 172838 | 115831 | 172343 | 120510 | 118832 |
| | $A_n$ (µm²) | 130331 | 161884 | 162502 | 138864 | 112799 | 130923 | 113680 | 108957 |
| | $A_u$ (µm²) | 32072 | 9848 | 5152 | 33974 | 3032 | 41420 | 6830 | 9875 |
| | $A_p$ (%) | 49.81% | 52.67% | 51.42% | 53.01% | 35.53% | 52.86% | 36.96% | 36.45% |
| | $A_n$ (%) | 39.97% | 49.65% | 49.84% | 42.59% | 34.60% | 40.15% | 34.87% | 33.42% |
| | $A_u$ (%) | 9.84% | 3.02% | 1.58% | 10.42% | 0.93% | 12.71% | 2.09% | 3.03% |
| Polishing characteristics of a pad | Polishing rate for a tungsten layer (Å/min) | 790 | 795 | 709 | 810 | 615 | 815 | 635 | 641 |
| | Within-wafer non-uniformity for a tungsten layer (%) | 4.2% | 2.9% | 3.8% | 9.8% | 4.1% | 10.3% | 4.5% | 4.2% |
| | Polishing rate for an oxide layer (Å/min) | 2931 | 2950 | 2912 | 2910 | 3151 | 2854 | 3121 | 3225 |
| | Within-wafer non-uniformity for an oxide layer (%) | 3.7% | 3.8% | 7.2% | 9.52% | 5.1% | 12.9% | 10.1% | 11.5% |

$D_a$ (µm): Number average diameter of pores (µm)
$A_r$ (µm²): Total measurement area
$A_p$ (µm²): Total area of a plurality of pores
$A_n$ (µm²): Area of the pores other than the pores having a diameter greater than the number average diameter of a plurality of pores by at least 200%
$A_u$ (µm²): Area of pores having a diameter greater than the number average diameter of a plurality of pores by at least 200%
$A_p$ (%): Total area ratio of a plurality of pores
$A_n$ (%): Area ratio of the pores ($A_n$) other than the pores having a diameter greater than the number average diameter of a plurality of pores by at least 200%
$A_u$ (%): Area ratio of the pores ($A_u$) having a diameter greater than the number average diameter of a plurality of pores by at least 200%

As can be seen from Table 2, in Examples 2-1 to 2-5, $D_a$ was in the range of 15 μm to 50 μm, and $A_u$ (%) was in the range of 0.9% to less than 12% of the total area of the polishing surface. In addition, when $D_a$ and $A_u$ (%) were within the above ranges, the polishing rate and the within-wafer non-uniformity for a tungsten layer and an oxide layer were remarkably excellent as compared with Comparative Examples 2-1 to 2-3.

Specifically, the polishing pads of Examples 2-1 to 2-5 had a polishing rate of 615 Å/min to 810 Å/min and 2,910 Å/min to 3,151 Å/min for a tungsten layer and an oxide layer, respectively. They also had an excellent within-wafer non-uniformity for a tungsten layer and an oxide layer as compared with the polishing pads of Comparative Examples 2-1 to 2-3.

In contrast, the polishing pad of Comparative Example 2-1 in which $A_u$ (%) exceeded 12% had a polishing rate of 2,854 Å/min and a within-wafer non-uniformity of 12.9% for an oxide layer, which were significantly lower than those of the Examples. In particular, the within-wafer non-uniformity for a tungsten layer and an oxide layer was 3.5 times inferior to that of the polishing pad of Example 2-2. This may be attributed to the fact that $A_u$ (%) fell outside the scope of the present invention since the degree of vacuum was adjusted to atmospheric pressure as compared with Example 2-1.

Meanwhile, the polishing pads of Comparative Examples 2-2 and 2-3 in which the $D_a$ (μm) value was less than 15 μm, the within-wafer non-uniformity for an oxide layer was significantly inferior to that of the Examples since the $D_a$ value was too low even though $A_u$ (%) fell within the scope of the present invention. This may be attributed to the fact that the $D_a$ (μm) value fell outside the scope of the present invention since the degree of vacuum was too low or adjusted to atmospheric pressure as compared with Example 2-5.

Meanwhile, in the polishing pad of Example 2-5, it was possible to achieve the $D_a$ (μm) and $A_u$ (%) values within the scope of the present invention by adjusting the charge rate and the degree of vacuum even though a gas phase foaming agent, a surfactant, and a reaction rate controlling agent were not used.

Accordingly, it has been found that a satisfactory polishing performance can be achieved by controlling the content of the solid phase foaming agent, the charge rate of the composition when it is charged and injected into a mold, and the degree of vacuum, even though a gas phase foaming agent is not used.

REFERENCE NUMERAL OF THE DRAWINGS

100: mold
a: discharge by depressurization
b: charge
110: polishing pad
120: platen
130: semiconductor substrate
140: nozzle
150: polishing slurry
160: polishing head
170: conditioner

The invention claimed is:

1. A polishing pad, which comprises a polishing layer comprising a plurality of pores,
wherein, in a diameter distribution of the plurality of pores, a number average diameter (Da) of the plurality of pores, defined as an average value obtained by dividing a sum of diameters of the plurality of pores by a number of the pores, ranges from 15 μm to 50 μm, and
an area ratio, defined as a percentage of an area (Au) of pores having a diameter at least 200% greater than the number average diameter of the plurality of pores to a total area of the polishing surface ranges from 0.9% to less than 12%,
wherein a diameter (Du) of pores having the diameter at least 200% greater than the number average diameter of the plurality of pores is 100 μm or more.

2. The polishing pad of claim 1, wherein a total area ratio of the plurality of pores, defined as a percentage of a total area of the plurality of pores to the total area of the polishing surface, ranges from 30% to 55%.

3. The polishing pad of claim 1, wherein a pore diameter at a maximum peak in the diameter distribution of the plurality of pores ranges from 60 μm to 150 μm.

4. The polishing pad of claim 1, wherein, when polishing a substrate having a tungsten layer and an oxide layer with a polishing rate ranging from 610 Å/min to 900 Å/min for the tungsten layer and, a polishing rate ranging from 2,860 Å/min to 3,250 Å/min for the oxide layer, the polishing of the substrate occurs with a within-wafer non-uniformity of less than 10% for the tungsten layer, and a within-wafer non-uniformity of less than 12% for the oxide layer.

5. The polishing pad of claim 1, wherein the polishing layer comprises a cured product of a composition comprising a urethane-based prepolymer, a curing agent, and a solid phase foaming agent, and the solid phase foaming agent has a D50 ranging from 20 μm to 50 μm, wherein D50 is a volume fraction of a 50th percentile of a particle diameter distribution.

6. The polishing pad of claim 5, wherein the solid phase foaming agent is a fine hollow particle having a shell, and the glass transition temperature (Tg) of the shell is 70° C. to 110° C.

* * * * *